(12) United States Patent
Park et al.

(10) Patent No.: US 12,008,932 B2
(45) Date of Patent: Jun. 11, 2024

(54) DISPLAY DEVICE AND MOTHER SUBSTRATE FOR DISPLAY DEVICE

(71) Applicant: Samsung Display Co., LTD., Yongin-si (KR)

(72) Inventors: Do Yeong Park, Hwaseong-si (KR); Chong Chul Chai, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/079,107

(22) Filed: Dec. 12, 2022

(65) Prior Publication Data
US 2023/0316964 A1    Oct. 5, 2023

(30) Foreign Application Priority Data

Mar. 29, 2022   (KR) .................. 10-2022-0038651

(51) Int. Cl.
  *G09G 3/00*      (2006.01)
  *G09G 3/32*      (2016.01)
  *H01L 21/66*     (2006.01)
(52) U.S. Cl.
  CPC .............. *G09G 3/006* (2013.01); *G09G 3/32* (2013.01); *G09G 2330/12* (2013.01); *H01L 22/32* (2013.01)
(58) Field of Classification Search
  CPC ...... G09G 3/006; G09G 3/32; G09G 2330/12; G09G 2300/0426; H10K 59/131; H01L 22/32
  See application file for complete search history.

(56) References Cited

U.S. PATENT DOCUMENTS

| 10,818,208 | B2 | 10/2020 | Yen | |
|---|---|---|---|---|
| 2003/0085855 | A1* | 5/2003 | Tomita | G09G 3/006 |
| | | | | 345/87 |
| 2021/0134198 | A1* | 5/2021 | Ma | G09G 3/20 |
| 2022/0157917 | A1* | 5/2022 | Park | H10K 59/1213 |
| 2022/0158054 | A1* | 5/2022 | Cha | H01L 27/156 |

FOREIGN PATENT DOCUMENTS

| KR | 10-2005-0052228 | 6/2005 |
|---|---|---|
| KR | 10-2017-0141305 | 12/2017 |
| KR | 10-2018-0009014 | 1/2018 |
| KR | 10-2018-0011404 | 2/2018 |

\* cited by examiner

*Primary Examiner* — Muhammad N Edun
(74) *Attorney, Agent, or Firm* — KILE PARK REED & HOUTTEMAN PLLC

(57) ABSTRACT

A display device comprises a display area and a first non-display area located on a side of the display area in a first direction, a first bus pattern disposed in the first non-display area, a second bus pattern disposed in the first non-display area and spaced apart from the first bus pattern in a second direction intersecting the first direction, first voltage lines disposed in the display area, extending in the first direction, and electrically connected to the first bus pattern, second voltage lines disposed in the display area, extending in the first direction, and electrically connected to the second bus pattern, and a first test pad disposed in the first non-display area and disposed between the first bus pattern and the second bus pattern.

20 Claims, 25 Drawing Sheets

DISPLAY DEVICE AND MOTHER SUBSTRATE FOR DISPLAY DEVICE

CROSS REFERENCE TO RELATED APPLICATION(S)

This application claims priority to and the benefit of Korean Patent Application No. 10-2022-0038651 under 35 U.S.C. § 119, filed on Mar. 29, 2022, in the Korean Intellectual Property Office (KIPO), the entire contents of which are incorporated herein by reference.

BACKGROUND

1. Technical Field

The disclosure relates to a display device and a mother substrate for the display device.

2. Description of the Related Art

Display devices are becoming increasingly important with the development of multimedia. Accordingly, various types of display devices such as organic light emitting displays and liquid crystal displays are being used.

A display device includes a display panel such as an organic light emitting display panel or a liquid crystal display panel as a device for displaying an image of the display device. The display panel may include a light emitting element, and the light emitting element may be a light emitting diode (LED). The LED may be an organic light emitting diode (OLED) using an organic material as a light emitting material or may be an inorganic LED using an inorganic material as a light emitting material.

SUMMARY

Aspects of the disclosure provide a mother substrate for a display device in which test reliability of alignment lines is improved.

Aspects of the disclosure also provide a display device with improved test reliability.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, a display device comprises a display area and a first non-display area located on a side of the display area in a first direction, a first bus pattern disposed in the first non-display area, a second bus pattern disposed in the first non-display area and spaced apart from the first bus pattern in a second direction intersecting the first direction, first voltage lines disposed in the display area, extending in the first direction, and electrically connected to the first bus pattern, second voltage lines disposed in the display area, extending in the first direction, and electrically connected to the second bus pattern, and a first test pad disposed in the first non-display area and disposed between the first bus pattern and the second bus pattern.

In an embodiment, the second bus pattern may not overlap the first voltage lines in the first direction, and the first bus pattern may not overlap the second voltage lines in the first direction.

In an embodiment, the first test pad may comprise a first sub-test pad electrically connected to the first bus pattern and a second sub-test pad electrically connected to the second bus pattern, and the first sub-test pad and the second sub-test pad may be spaced apart from each other.

In an embodiment, the display device may further comprise a third bus pattern disposed in the first non-display area and spaced apart from the first bus pattern and the second bus pattern, a fourth bus pattern disposed in a second non-display area spaced apart from the first non-display area in the first direction with the display area disposed between the fourth bus pattern and the first non-display area, and a second test pad disposed adjacent to the third bus pattern in the first non-display area, wherein the third bus pattern and the fourth bus pattern may be connected to the first voltage lines.

In an embodiment, the second test pad may comprise a third sub-test pad electrically connected to the third bus pattern and a fourth sub-test pad electrically connected to the fourth bus pattern, and the third sub-test pad and the fourth sub-test pad may be spaced apart from each other.

In an embodiment, the display device may further comprise an alignment dummy pattern disposed in the second non-display area and connected to the fourth bus pattern.

In an embodiment, the third bus pattern and the fourth bus pattern may overlap each other in the first direction.

In an embodiment, the display device may further comprise a first electrode and a second electrode disposed in the display area, extending in the first direction, and spaced apart from each other in the second direction, wherein the second electrode may be electrically connected to an of the second voltage lines through an electrode contact hole.

In an embodiment, the display device may further comprise a first dummy pattern spaced apart from the first electrode in the first direction, wherein the first dummy pattern may be electrically connected to one of the first voltage lines through an alignment contact hole.

In an embodiment, the display device may further comprise a light emitting element disposed between the first electrode and the second electrode.

According to an aspect of the disclosure, a display device may comprise a display area, a first non-display area located on a side of the display area in a first direction, and a second non-display area located on another side of the display area in the first direction, a first bus pattern and a second bus pattern disposed in the first non-display area and spaced apart from each other, a third bus pattern and a fourth bus pattern disposed in the second non-display area and spaced apart from each other, a first voltage line disposed in the display area and electrically connected to the first bus pattern and the third bus pattern, a second voltage line disposed in the display area and electrically connected to the second bus pattern and the fourth bus pattern, a first test pad disposed between the first bus pattern and the second bus pattern in the first non-display area, and a first alignment dummy pattern electrically connected to the third bus pattern and a second alignment dummy pattern electrically connected to the fourth bus pattern in the second non-display area.

In an embodiment, the first bus pattern and the third bus pattern may overlap each other in the first direction, and the second bus pattern and the fourth bus pattern may overlap each other in the first direction.

In an embodiment, the display device may further comprise a first electrode and a second electrode spaced apart from each other on the first voltage line and the second voltage line in the display area, and a light emitting element disposed between the first electrode and the second electrode, wherein the second electrode may be electrically connected to the second voltage line through an electrode contact hole.

In an embodiment, the first alignment dummy pattern and the second alignment dummy pattern may be aligned with a side of the display device adjacent to the second non-display area.

In an embodiment, the display device may further comprise a second test pad disposed between the third bus pattern and the fourth bus pattern in the second non-display area.

In an embodiment, the display device may further comprise a fifth bus pattern disposed in the first non-display area, spaced apart from the first bus pattern and the second bus pattern, and electrically connected to the first voltage line, and a second test pad disposed adjacent to the fifth bus pattern in the first non-display area.

In an embodiment, the display device may further comprise a sixth bus pattern disposed in the second non-display area, spaced apart from the third bus pattern and the fourth bus pattern, and electrically connected to the first voltage line, wherein the second test pad may comprise a first sub-test pad electrically connected to the fifth bus pattern and a second sub-test pad electrically connected to the sixth bus pattern, and the first sub-test pad and the second sub-test pad may be spaced apart from each other.

In an embodiment, the first test pad may comprise a first sub-test pad electrically connected to the first bus pattern and a second sub-test pad electrically connected to the second bus pattern, wherein the first sub-test pad and the second sub-test pad may be spaced apart from each other.

According to an aspect of the disclosure, a mother substrate for a display device, the mother substrate comprises a cell area that is defined by a cutting line and comprises a display area, a first non-display area located on a side of the display area in a first direction and a second non-display area located on another side of the display area in the first direction, and a cell peripheral area, a first bus pattern and a second bus pattern disposed in the first non-display area and spaced apart from each other, a third bus pattern and a fourth bus pattern disposed in the second non-display area and spaced apart from each other, a first voltage line disposed in the display area and electrically connected to the first bus pattern and the third bus pattern, a second voltage line disposed in the display area and electrically connected to the second bus pattern and the fourth bus pattern, a first test pad disposed between the first bus pattern and the second bus pattern in the first non-display area, and a first alignment pad and a second alignment pad disposed in the cell peripheral area adjacent to the second non-display area.

In an embodiment, the mother substrate may further comprise a first alignment line electrically connected to the first voltage line, and a second alignment line electrically connected to the second voltage line.

In a display device and a mother substrate for the display device according to an embodiment, test pads for testing whether alignment lines are shorted or open may be formed in a second non-display area located on the other side of a first non-display area in which alignment bus lines or alignment connection lines used in an alignment process are formed. Accordingly, a display area may be located between the alignment bus lines or the alignment connection lines and the test pads. In this case, when a process of testing the alignment lines is performed using the test pads, a test current generated by a test voltage applied to the test pads may be induced to essentially flow through the display area even when the alignment bus lines or the alignment connection lines are shorted or open. Therefore, it may be easy to distinguish whether a defect has occurred in the display area or outside the display area in the process of testing the alignment lines using the test pads. Accordingly, the reliability of the process of testing the alignment lines of the display device can be improved.

In addition, since the reliability of the process of testing the alignment lines is improved, the degree of alignment of light emitting elements disposed between first and second electrodes can be improved.

However, the effects of the disclosure are not restricted to the one set forth herein. The above and other effects of the disclosure will become more apparent to one of daily skill in the art to which the disclosure pertains by referencing the claims.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
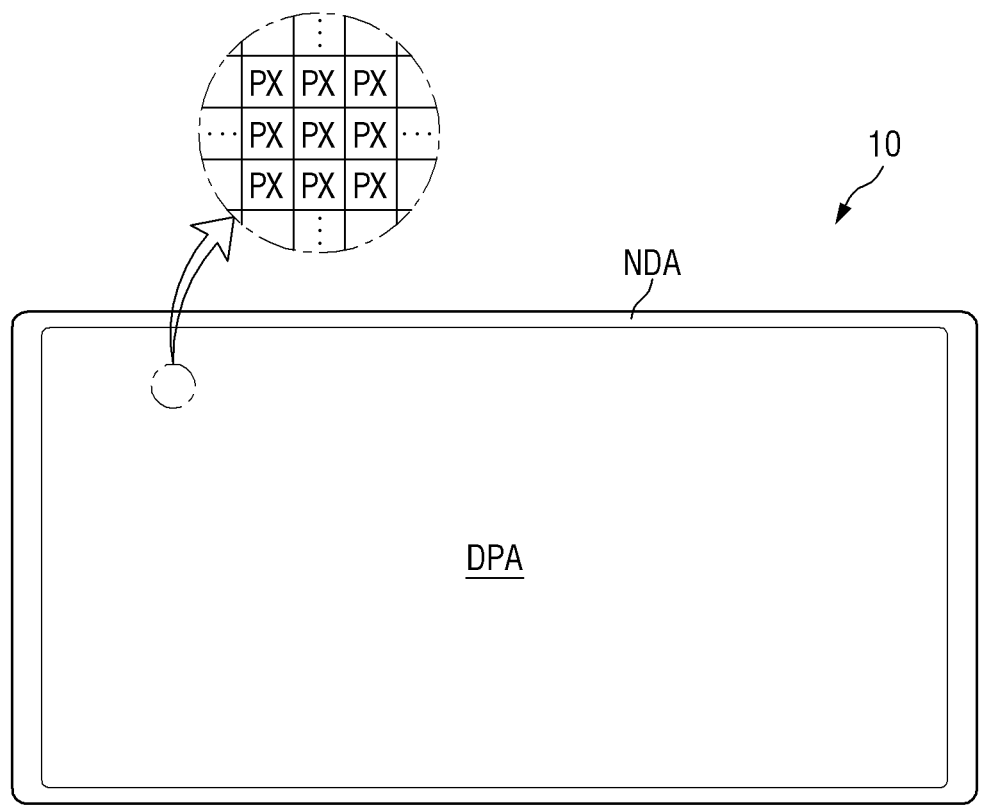
FIG. 1 is a schematic plan view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will convey the scope of the disclosure to those skilled in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, specific embodiments will be described with reference to the accompanying drawings.

FIG. 1 is a schematic plan view of a display device 10 according to an embodiment.

Referring to FIG. 1, the display device 10 displays moving images or still images. The display device 10 may refer to any electronic device that provides a display screen. Examples of the display device 10 may include a television, a laptop computer, a monitor, a billboard, an Internet of things (IoT) device, a mobile phone, a smartphone, a tablet personal computer (PC), an electronic watch, a smartwatch, a watch phone, a head-mounted display, a mobile communication terminal, an electronic notebook, an e-book reader, a portable multimedia player (PMP), a navigation device, a game console, a digital camera and a camcorder, all of which provide a display screen.

The display device 10 includes a display panel that provides a display screen. Examples of the display panel include an inorganic light emitting diode display panel, an organic light emitting display panel, a quantum dot light emitting display panel, a plasma display panel, and a field emission display panel. A case where an inorganic light emitting diode display panel is applied as an example of the display panel will be described below, but the disclosure is not limited to this case, and other display panels can also be applied as long as the same technical spirit is applicable.

In the drawings of embodiments for explaining the display device 10, a first direction DR1, a second direction DR2, and a third direction DR3 are defined. The first direction DR1 and the second direction DR2 may be directions perpendicular to each other in a plane. The third direction DR3 may be a direction perpendicular to the plane in which the first direction DR1 and the second direction DR2 are located. The third direction DR3 is perpendicular to each of the first direction DR1 and the second direction DR2. In the embodiments for explaining the display device 10, the third direction DR3 indicates a thickness direction (or a display direction) of the display device 10.

The display device 10 may have a rectangular shape including long sides in the first direction DR1 and short sides in the second direction DR2 in a plan view. Each corner where a long side and a short side of the display device 10 meet each other may be right-angled in a plan view. However, the disclosure is not limited thereto, and each corner may also have a rounded or curved shape. The shape of the display device 10 is not limited to the rectangular shape and can be variously modified. For example, the display device 10 may also have other planar shapes such as a square, a quadrilateral with rounded corners (vertices), other polygons, or a circle.

A display surface of the display device 10 may be disposed on a side in the third direction DR3 which is the thickness direction. In the embodiments for explaining the display device 10, unless otherwise mentioned, "above" refers to a side in the third direction DR3 and the display direction, and an "upper surface" refers to a surface facing the side in the third direction DR3. "Below" refers to the other side in the third direction DR3 and a direction opposite to the display direction, and a "lower surface" refers to a surface facing the other side in the third direction DR3. In addition, "left," "right," "upper," and "lower" refer to directions when the display device 10 is seen in a plan view. For example. "right" refers to a side in the first direction DR1, "left" refers to the other side in the first direction DR1, "upper" refers to a side in the second direction DR2, and "lower" refers to the other side in the second direction DR2.

The display device 10 may include a display area DPA and a non-display area NDA. The display area DPA is an area where an image can be displayed, and the non-display area NDA is an area where no image is displayed.

The shape of the display area DPA may follow the shape of the display device 10. For example, the display area DPA may have a rectangular planar shape similar to the overall shape of the display device 10. The display area DPA may generally occupy a center of the display device 10.

The display area DPA may include pixels PX. The pixels PX may be arranged in a matrix direction. Each of the pixels PX may be rectangular or square in a plan view. In an embodiment, each pixel PX may include light emitting elements made of inorganic particles.

The non-display area NDA may be disposed around the display area DPA. The non-display area NDA may entirely or partially surround the display area DPA. The non-display area NDA may form a bezel of the display device 10.

Figure 2:
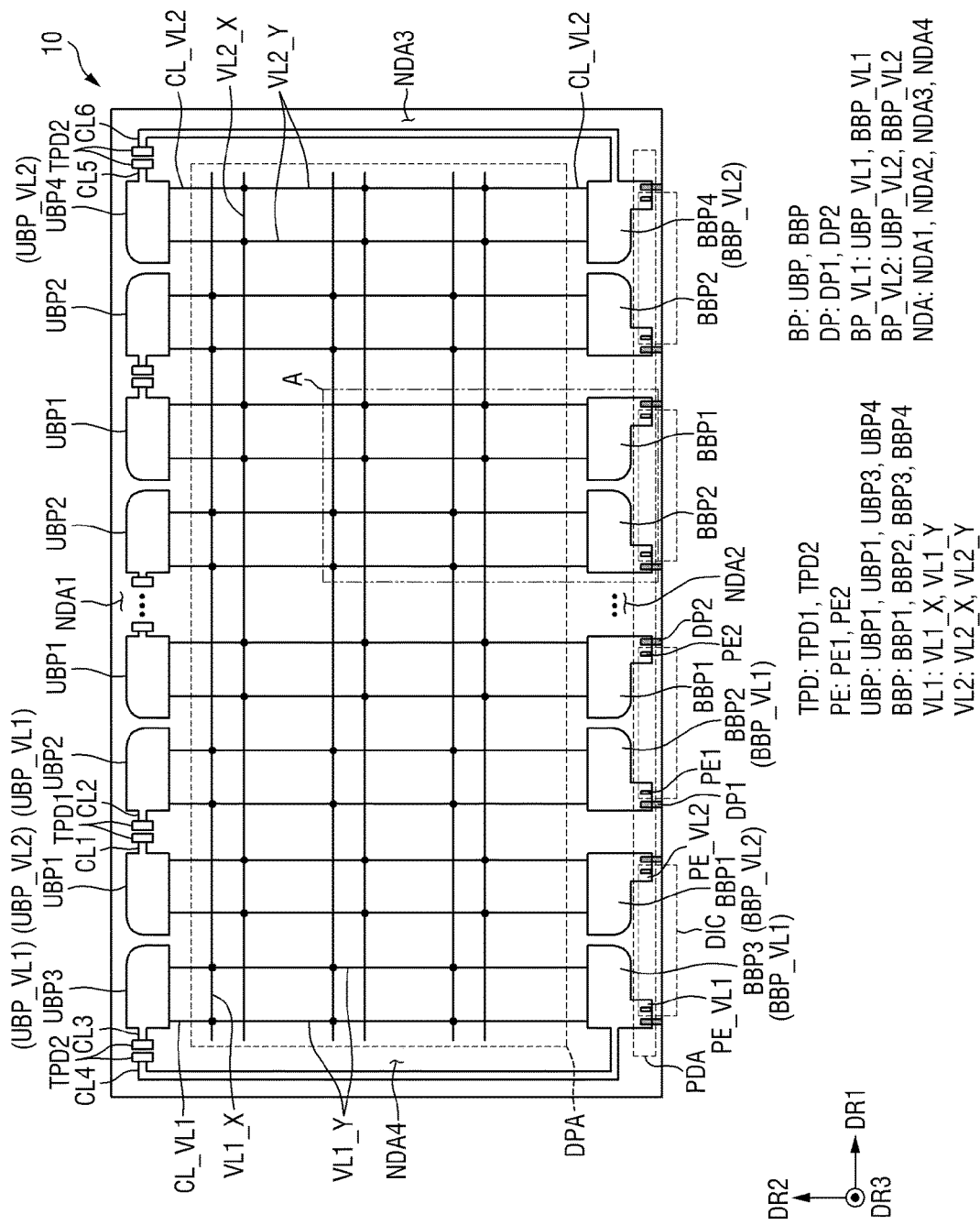
FIG. 2 is a schematic plan layout view of the display device according to the embodiment.

FIG. 2 is a schematic plan layout view of the display device 10 according to the embodiment.

Referring to FIG. 2, the display device 10 may include wirings and pads. In the specification, the term "connect" may mean that any one member and another member are connected to each other not only through physical contact but also through another member. In addition, it can be understood that any one part and another part are connected to each other as one integrated member. Further, the connection between any one member and another member can be interpreted to include electrical connection through another member in addition to connection through direct contact.

Signal wirings and power wirings that provide driving signals and power to the pixels PX may be disposed in the display area DPA. For example, in the display area DPA, first voltage lines VL1 providing a high potential voltage (or a first power supply voltage) to the pixels PX and second voltage lines VL2 providing a low potential voltage (or a second power supply voltage) lower than the high potential voltage to the pixels PX may be disposed. Although not illustrated in the drawing, other wirings such as data lines transmitting data signals to the pixels PX, scan lines transmitting scan signals to the pixels PX, and initialization voltage lines may be further included in the display area DPA.

The first voltage lines VL1 may include first horizontal voltage lines VL1_X extending in the first direction DR1 and first vertical voltage lines VL1_Y extending in the second direction DR2. The first horizontal voltage lines VL1_X and the first vertical voltage lines VL1_Y may intersect each other. The first voltage lines VL1 may have a mesh structure. The first horizontal voltage lines VL1_X and the first vertical voltage lines VL1_Y may be made of conductive layers disposed on different layers. The first horizontal voltage lines VL1_X and the first vertical voltage lines VL1_Y may be electrically connected to each other at intersections of them.

The second voltage lines VL2 may include second horizontal voltage lines VL2_X extending in the first direction DR1 and second vertical voltage lines VL2_Y extending in the second direction DR2. The second horizontal voltage lines VL2_X and the second vertical voltage lines VL2_Y may intersect each other. The second voltage lines VL2 may have a mesh structure. The second horizontal voltage lines VL2_X and the second vertical voltage lines VL2_Y may be made of conductive layers disposed on different layers. The second horizontal voltage lines VL2_X and the second vertical voltage lines VL2_Y may be electrically connected to each other at intersections of them.

In the non-display area NDA, transmission wirings (or bus patterns BP) for transmitting driving signals or power to the display area DPA, test pads TPD, and driving circuits or driving elements for driving the display area DPA may be disposed.

The bus patterns BP may be disposed in a first non-display area NDA1 located above the display area DPA and a second non-display area NDA2 located below the display area DPA.

The bus patterns BP may include upper bus patterns UBP and lower bus patterns BBP classified according to where they are disposed with respect to the display area DPA. The upper bus patterns UBP may be disposed in the first non-display area NDA1, and the lower bus patterns BBP may be disposed in the second non-display area NDA2. Accordingly, the upper bus patterns UBP may be disposed adjacent to an upper side of the display area DPA, and the lower bus patterns BBP may be disposed adjacent to a lower side of the display area DPA. As another example, the upper bus patterns UBP may be disposed adjacent to an upper side of the display device 10, and the lower bus patterns BBP may be disposed adjacent to a lower side of the display device 10.

Upper bus patterns UBP may be provided and may be spaced apart from each other in the first direction DR1. In an embodiment, the upper bus patterns UBP may be arranged side by side in a same row in the first direction DR1.

The upper bus patterns UBP may include first and second upper bus patterns UBP1 and UBP2 connected to first test pads TPD1 and third and fourth upper bus patterns UBP3 and UBP4 connected to second test pads TPD2. The first to fourth upper bus patterns UBP1 to UBP4 may be arranged in the first direction DR1 in the first non-display area NDA1 and may be spaced apart from each other.

The first test pads TPD1 may be test pads TPD for testing whether a short has occurred between the first voltage lines VL1, the second voltage lines VL2, and first and second alignment lines 210' and 220', which will be described below, in the display area DPA. The second test pads TPD2 are test pads TPD for testing whether the first voltage lines VL1, the second voltage lines VL2, or the first and second alignment lines 210' and 220' are open. The first test pads TPD1 may be disposed in the first non-display area NDA1.

The first upper bus patterns UBP1 and the second upper bus patterns UBP2 may be disposed adjacent to each other in the first direction DR1. The first test pads TPD1 respectively connected to the first and second upper bus patterns UBP1 and UBP2 may be disposed between the first and second upper bus patterns UBP1 and UBP2. Each of the first upper bus patterns UBP1 may be connected to a first test pad TPD1 through a first connection line CL1, and each of the second upper bus patterns UBP2 may be connected to a first test pad TPD1 through a second connection line CL2.

First upper bus patterns UBP1 and second upper bus patterns UBP2 may be provided. The first upper bus patterns UBP1 and the second upper bus patterns UBP2 may be alternately arranged in the first direction DR1. The first test pads TPD1 may be disposed in each space between the first upper bus patterns UBP1 and the second upper bus patterns UBP2.

The third upper bus pattern UBP3 may be a leftmost upper bus pattern UBP among the upper bus patterns UBP. The third upper bus pattern UBP3 may be disposed adjacent to a left side of a leftmost first upper bus pattern UBP1 among the first upper bus patterns UBP1.

The fourth upper bus pattern UBP4 may be a rightmost upper bus pattern UBP among the upper bus patterns UBP. The fourth upper bus pattern UBP4 may be disposed adjacent to a right side of a rightmost second upper bus pattern UBP2 among the second upper bus patterns UBP2.

Lower bus patterns BBP may be provided and may be spaced apart from each other in the first direction DR1. In an embodiment, the lower bus patterns BBP may be arranged side by side in a same row in the first direction DR1.

The lower bus patterns BBP may include first to fourth lower bus patterns BBP1 to BBP4 respectively corresponding to the first to fourth upper bus patterns UBP1 to UBP4. Accordingly, the third lower bus pattern BBP3 may be a leftmost lower bus pattern BBP among the lower bus patterns BBP, and the fourth lower bus pattern BBP4 may be a rightmost lower bus pattern BBP among the lower bus patterns BBP.

The second test pads TPD2 may be disposed adjacent to the third and fourth upper bus patterns UBP3 and UBP4. Second test pads TPD2 may be provided. A second test pad TPD2 disposed adjacent to the third upper bus pattern UBP3 among the second test pads TPD2 may be connected to the third upper bus pattern UBP3 through a third connection line CL3, and another second test pad TPD2 among the second test pads TPD2 may be connected to the third lower bus pattern BBP3 through a fourth connection line CL4. A second test pad TPD2 disposed adjacent to the fourth upper bus pattern UBP4 among the second test pads TPD2 may be connected to the fourth upper bus pattern UBP4 through a fifth connection line CL5, and another second test pad TPD2 among the second test pads TPD2 may be connected to the fourth lower bus pattern BBP4 through a sixth connection line CL6. The fourth connection line CL4 may be disposed in the first non-display area NDA1, the second non-display area NDA2 and a fourth non-display area NDA4, and the sixth connection line CL6 may be disposed in the first non-display area NDA1, the second non-display area NDA2 and a third non-display area NDA3.

The bus patterns BP may include first voltage bus patterns BP_VL1 and second voltage bus patterns BP_VL2 classified according to voltage lines to which they are connected among the first and second voltage lines VL1 and VL2 disposed in the display area DPA. The first voltage bus patterns BP_VL1 may be electrically connected to the first voltage lines VL1, and the second voltage bus patterns BP_VL2 may be electrically connected to the second voltage lines VL2. The first voltage bus patterns BP_VL1 may be bus wirings that transfer the first power supply voltage to the first voltage lines VL1, and the second voltage bus patterns BP_VL2 may be bus wirings that transfer the second power supply voltage to the second voltage lines VL2.

The first voltage bus patterns BP_VL1 may be electrically connected to the first voltage lines VL1 disposed in the display area DPA through first voltage connection lines CL_VL1. The first voltage bus patterns BP_VL1 may include first upper voltage bus patterns UBP_VL1 disposed in the first non-display area NDA1 and first lower voltage bus patterns BBP_VL1 disposed in the second non-display area NDA2.

First vertical voltage lines VL1_Y may be disposed between each of the first upper voltage bus patterns UBP_VL1 and each of the first lower voltage bus patterns BBP_VL1. The first upper and lower voltage bus patterns UBP_VL1 and BBP_VL1 may be disposed adjacent to ends of the first vertical voltage lines VL1_Y and may be electrically connected to the first vertical voltage lines VL1_Y through the first voltage connection lines CL_VL1. The first upper and lower voltage bus patterns UBP_VL1 and BBP_VL1 may respectively correspond to each other and may be disposed at ends of the first vertical voltage lines VL1_Y. The second vertical voltage lines VL2_Y may not be disposed between the first upper voltage bus patterns UBP_VL1 and the first lower voltage bus patterns BBP_VL1.

The second upper bus patterns UBP2 and the third upper bus pattern UBP3 described above may be the first upper voltage bus patterns UBP_VL1 disposed in the first non-display area NDA1 and electrically connected to the first voltage lines VL1, and the second lower bus patterns BBP2 and the third lower bus pattern BBP3 described above may be the first lower voltage bus patterns BBP_VL1 disposed in the second non-display area NDA2 and electrically connected to the first voltage lines VL1.

The second voltage bus patterns BP_VL2 may be electrically connected to the second voltage lines VL2 disposed in the display area DPA through second voltage connection lines CL_VL2. The second voltage bus patterns BP_VL2 may include second upper voltage bus patterns UBP_VL2 disposed in the first non-display area NDA1 and second lower voltage bus patterns BBP_VL2 disposed in the second non-display area NDA2.

The second voltage bus patterns BP_VL2 may be spaced apart from the first voltage bus patterns BP_VL1 in the first direction DR1. Second vertical voltage lines VL2_Y may be disposed between each of the second upper voltage bus patterns UBP_VL2 and each of the second lower voltage bus patterns BBP_VL2. The second upper and lower voltage bus patterns UBP_VL2 and BBP_VL2 may be disposed adjacent to ends of the second vertical voltage lines VL2_Y and may be electrically connected to the second vertical voltage lines VL2_Y through the second voltage connection lines CL_VL2. The second upper and lower voltage bus patterns UBP_VL2 and BBP_VL2 may respectively correspond to each other and may be disposed adjacent to ends of the second vertical voltage lines VL2_Y. The first vertical voltage lines VL1_Y may not be disposed between the second upper and lower voltage bus patterns UBP_VL2 and BBP_VL2.

The first upper bus patterns UBP1 and the fourth upper bus pattern UBP4 described above may be the second upper voltage bus patterns UBP_VL2 disposed in the first non-display area NDA1 and electrically connected to the second voltage lines VL2, and the first lower bus patterns BBP1 and the fourth lower bus pattern BBP4 described above may be the second lower voltage bus patterns BBP_VL2 disposed in the second non-display area NDA2 and electrically connected to the second voltage lines VL2.

The first voltage bus patterns BP_VL1 and the second voltage bus patterns BP_VL2 may be disposed adjacent to each of the upper and lower sides of the display area DPA. The first voltage bus patterns BP_VL1 and the second voltage bus patterns BP_VL2 may be spaced apart from each other in the first direction DR1 in the first and second non-display areas NDA1 and NDA2. First voltage bus patterns BP_VL1 and second voltage bus patterns BL_VL2 may be provided. The first voltage bus patterns BP_VL1 and the second voltage bus patterns BP_VL2 may be alternately disposed in the first direction DR1. Accordingly, a first voltage bus pattern BP_VL1 and a second voltage bus pattern BP_VL2 may be respectively disposed on the left and right sides to form a pair corresponding to a driving circuit DIC.

The first test pads TPD1 may be disposed adjacent to the first and second upper bus patterns UBP1 and UBP2 connected to different voltage lines among the upper bus patterns UBP. The first upper bus patterns UBP1 may be the second upper voltage bus patterns UBP_VL2, and the second upper bus patterns UBP2 may be the first upper voltage bus patterns UBP_VL1. For example, the first test pads TPD1 may be respectively connected to different upper voltage bus patterns. Accordingly, the first test pads TPD1 may be short test pads TPD1 for testing whether a short has occurred between the first and second voltage lines VL1 and VL2 or between the first and second alignment lines 210' and 220' to be described below. In other words, the first test pads TPD1 may be short test pads TPD1 for testing whether a short has occurred between different voltage lines or different alignment lines.

The second test pads TPD2 may be disposed between the third upper bus pattern UBP3 and the third lower bus pattern BBP3 or between the fourth upper bus pattern UBP4 and the fourth lower bus pattern BBP4 connected to same voltage lines among the upper bus patterns UBP and the lower bus patterns BBP. The second test pads TPD2 may be disposed adjacent to each of the third upper bus pattern UBP3 and the fourth upper bus pattern UBP4. The second test pads TPD2 may be connected to same voltage bus patterns, and specifically, may be connected to the first upper and lower voltage bus patterns UBP_VL1 and BBP_VL1 or the second upper and lower voltage bus patterns UBP_VL2 and BBP_VL2. Accordingly, the second test pads TPD2 may be open test pads TPD2 for testing whether the first voltage lines VL1 or the first alignment lines 210' are open or may be open test pads TPD2 for testing whether the second voltage lines VL2 or the second alignment lines 220' are open. In other words, the second test pads TPD2 may be open test pads TPD2 for testing whether same voltage lines or alignment lines are open.

First wiring pads PE_VL1 may protrude downward from the first lower voltage bus patterns BBP_VL1 to lie in a pad area PDA, and second wiring pads PE_VL2 may protrude downward from the second lower voltage bus patterns BBP_VL2 to lie in the pad area PDA. Each of the first wiring pads PE_VL1 may be integrated with a first lower voltage bus pattern BBP_VL1 to form a single pattern, and each of the second wiring pads PE_VL2 may be integrated with a second lower voltage bus pattern BBP_VL2 to form a single pattern.

Pad electrodes PE may be disposed on the first wiring pads PE_VL1 and the second wiring pads PE_VL2, respectively. The pad electrodes PE may include first pad electrodes PE1 disposed on the first wiring pads PE_VL1 and second pad electrodes PE2 disposed on the second wiring pads PE_VL2. Driving circuits DIC may be disposed on the first pad electrodes PE1 and the second pad electrodes PE2. A first pad electrode PE1 may be disposed on a left side of each driving circuit DIC, and a second pad electrode PE2 may be disposed on a right side of each driving circuit DIC. Each driving circuit DIC may be attached onto the first and second pad electrodes PE1 and PE2.

The driving circuits DIC may output voltages for driving each pixel PX of the display device 10. For example, the driving circuits DIC may supply the first power supply voltage and the second power supply voltage to the first voltage lines VL1 and the second voltage lines VL2, respectively. The driving circuits DIC may be formed as integrated circuits and may be mounted on the first pad electrodes PE1 and the second pad electrodes PE2 of the display device 10 in the pad area PDA by a chip-on-glass (COG) method, a chip-on-plastic (COP) method, or an ultrasonic bonding method, but the disclosure is not limited thereto. Each of the driving circuits DIC may also be mounted on a separate circuit board, and the circuit board may be attached onto the first and second pad electrodes PE1 and PE2 using an anisotropic conductive film. Therefore, lead lines of the circuit board may be electrically connected to the first and second pad electrodes PE1 and PE2. The circuit board may be a flexible printed circuit board, a printed circuit board, or a flexible film such as a chip-on-film.

Driving circuits DIC may be provided, and each of the driving circuits DIC may be disposed between the first and second wiring pads PE_VL1 and PE_VL2 adjacent to each other in the first direction DR1. A first wiring pad PE_VL1 connected to a first lower voltage bus pattern BBP_VL1 and a second wiring pad PE_VL2 connected to a second lower voltage bus pattern BBP_VL2 may be disposed on the left and right sides of a driving circuit DIC, respectively. Accordingly, the display device 10 according to the embodiment may have a structure in which first vertical voltage lines VL1_Y and second vertical voltage lines VL2_Y are respectively disposed on the left and right sides of a driving circuit DIC.

The display device 10 may further include alignment dummy patterns DP. The alignment dummy patterns DP may be spaced apart from the test pads TPD in the second direction DR2 with the display area DPA interposed between them. For example, in an embodiment in which the test pads TPD are disposed in the first non-display area NDA1, the alignment dummy patterns DP may be disposed in the second non-display area NDA2 facing the first non-display area NDA1 with the display area DPA interposed between them. This may be intended to improve test reliability of alignment lines 200' by, as will be described below, forming alignment connection lines and the test pads TPD such that the display area DPA is located between the alignment connection lines (or alignment bus lines) and the test pads TPD used in a test process for testing whether the alignment lines 200' are defective before an inkjet process and an alignment process for aligning light emitting elements ED are performed during a manufacturing process of the display device 10. This will be described in detail below.

The alignment dummy patterns DP may include first alignment dummy patterns DP1 and second alignment dummy patterns DP2. The first alignment dummy patterns DP1 may be disposed on the first wiring pads PE_VL1 and electrically connected to the first wiring pads PE_VL1. The second alignment dummy patterns DP2 may be disposed on the second wiring pads PE_VL2 and electrically connected to the second wiring pads PE_VL2. An end of each of the first and second alignment dummy patterns DP1 and DP2 may be disposed on a first or second wiring pad PE_VL1 or PE_VL2, and another end of each of the first and second alignment dummy patterns DP1 and DP2 may be aligned with the lower side of the display device 10. As will be described below, the first and second alignment dummy patterns DP1 and DP2 may be dummy patterns formed by partially cutting alignment connection lines for connecting alignment pads and the first and second lower voltage bus patterns BBP_VL1 and BBL_VL2 to transmit alignment signals to alignment lines in the alignment process of the light emitting elements ED during the manufacturing process of the display device 10.

Figure 3:
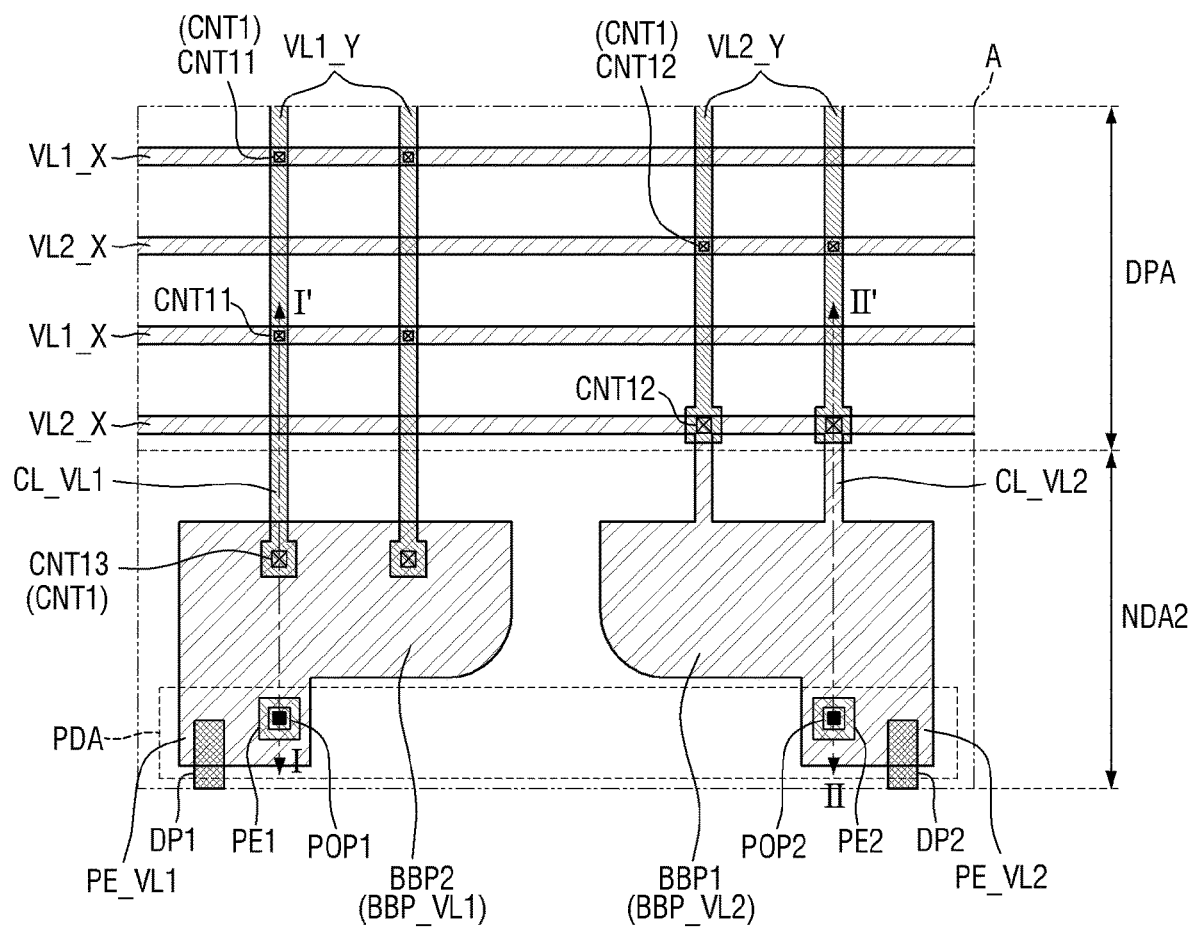
FIG. 3 is an enlarged plan view of area A of FIG. 2.

FIG. 3 is a schematic enlarged plan view of area A of FIG. 2.

Referring to FIGS. 2 and 3, the display device 10 may include a bottom metal layer 110, a first conductive layer 130 (see FIG. 7), and a second conductive layer 140. The display device 10 may further include contact holes CNT1 including first, second, and third contact holes CNT11, CNT12, and CNT13.

The bottom metal layer 110 may include first vertical voltage lines VL1_Y, second vertical voltage lines VL2_Y, and first voltage connection lines CL_VL1. For example, the first vertical voltage lines VL1_Y, the second vertical voltage lines VL2_Y, and the first voltage connection lines CL_VL1 may be made of the bottom metal layer 110 and may be formed on a same layer.

The second conductive layer 140 may include first horizontal voltage lines VL1_X, second horizontal voltage lines VL2_X, second voltage connection lines CL_VL2, a first wiring pad PE_VL1, a second wiring pad PE_VL2, a first lower voltage bus pattern BBP_VL1, and a second lower voltage bus pattern BBP_VL2. For example, the first horizontal voltage lines VL1_X, the second horizontal voltage lines VL2_X, the second voltage connection lines CL_VL2, the first wiring pad PE_VL1, the second wiring pad PE_VL2, the first lower voltage bus pattern BBP_VL1, and the second lower voltage bus pattern BBP_VL2 may be made of the second conductive layer 140 and may be formed on a same layer. The second conductive layer 140 may be disposed on the bottom metal layer 110. Although FIG. 3 illustrates only the bus patterns BP disposed in the second non-display area NDA2, the first and second upper voltage bus patterns UBP_VL1 and UBP_VL2 disposed in the first non-display area NDA1 may also be made of the second conductive layer 140.

The first vertical voltage lines VL1_Y may extend in the second direction DR2 in the display area DPA. The first vertical voltage lines VL1_Y may intersect the first horizontal voltage lines VL1_X of the second conductive layer 140 extending in the first direction DR1 in the display area DPA. The first vertical voltage lines VL1_Y may be electrically connected to the first horizontal voltage lines VL1_X through first contact holes CNT11 at intersections with the first horizontal voltage lines VL1_X.

The first voltage connection lines CL_VL1 may be disposed between the first vertical voltage lines VL1_Y and a first voltage bus pattern BP_VL1 in a plan view. The first voltage connection lines CL_VL1 may extend downward (or in a direction opposite to the second direction DR2) from the first vertical voltage lines VL1_Y in a plan view to lie in the second non-display area NDA2. Although not illustrated in FIG. 3, the first voltage connection lines CL_VL1 may extend upward (or in the second direction DR2) from the first vertical voltage lines VL1_Y in a plan view to lie in the first non-display area NDA1. In an embodiment, the first vertical voltage lines VL1_Y and the first voltage connection lines CL_VL1 may be integral with each other without being physically separated from each other.

Each of the first voltage connection lines CL_VL1 may have an end connected to a first vertical voltage line VL1_Y in the second non-display area NDA2 and another end connected to the first lower voltage bus pattern BBP_VL1 made of the second conductive layer 140. Accordingly, the first voltage connection lines CL_VL1 may be disposed between the first vertical voltage lines VL1_Y and the first lower voltage bus pattern BBP_VL1 in the second non-display area NDA2 to electrically connect them. An end of each of the first voltage connection lines CL_VL1 may be integral with a first vertical voltage line VL1_Y and thus physically connected to the first vertical voltage line VL1_Y, and another end of each of the first voltage connection lines CL_VL1 may physically contact the first lower voltage bus pattern BBP_VL1 through a third contact hole CNT13 and thus may be electrically connected to the first lower voltage bus pattern BBP_VL1. Each of the first voltage connection lines CL_VL1 may have an end connected to a first vertical voltage line VL1_Y in the first non-display area NDA1 and another end connected to a first upper voltage bus pattern UBP_VL1 made of the second conductive layer 140.

The first lower voltage bus pattern BBP_VL1 may physically contact first voltage connection lines CL_VL1 through the third contact holes CNT13. Accordingly, the first lower voltage bus pattern BBP_VL1 may be electrically connected to first vertical voltage lines VL1_Y disposed adjacent to the first lower voltage bus pattern BBP_VL1 in the second direction DR2.

The first lower voltage bus pattern BBP_VL1 may not extend in a direction and may be formed as an island-shaped pattern in a plan view. Accordingly, the first lower voltage bus pattern BBP_VL1 may not overlap the second voltage connection lines CL_VL2 and/or the second lower voltage bus pattern BBP_VL2 in a plan view. The first voltage connection lines CL_VL1 may not overlap the second voltage connection lines CL_VL2 and/or the second lower voltage bus pattern BBP_VL2 in a plan view. Accordingly, this can minimize a short that may occur between the first lower voltage bus pattern BBP_VL1, the first voltage connection lines CL_VL1, the second voltage connection lines CL_VL2, and the second lower voltage bus pattern BBP_VL2 during the manufacturing process of the display device 10.

The first wiring pad PE_VL1 may be integrated with the first lower voltage bus pattern BBP_VL1 to form a single pattern. The first wiring pad PE_VL1 may protrude downward from the first lower voltage bus pattern BBP_VL1 to lie in the pad area PDA. A first pad electrode PE1 may be disposed on the first wiring pad PE_VL1. The first pad electrode PE1 may be electrically connected to the first wiring pad PE_VL1 by physically contacting the first wiring pad PE_VL1 through a first pad opening POP1. The first wiring pad PE_VL1 and the first pad electrode PE1 may form a first voltage pad electrically connected to a driving circuit DIC.

The second vertical voltage lines VL2_Y may extend in the second direction DR2 in the display area DPA. The second vertical voltage lines VL2_Y may end on each of the upper side and the lower side of the display area DPA. The second vertical voltage lines VL2_Y may intersect the second horizontal voltage lines VL2_X of the second conductive layer 140 extending in the first direction DR1 in the display area DPA. The second vertical voltage lines VL2_Y may be electrically connected to the second horizontal voltage lines VL2_X through second contact holes CNT12 at intersections with the second horizontal voltage lines VL2_X.

The second voltage connection lines CL_VL2 may be disposed between a second horizontal voltage line VL2_X and a second voltage bus pattern BP_VL2 in a plan view. The second voltage connection lines CL_VL2 may extend downward (or in the direction opposite to the second direction DR2) from a lowest second horizontal voltage line VL2_X in a plan view to lie in the second non-display area NDA2. The second voltage connection lines CL_VL2 may be integrated with the lowest second horizontal voltage line VL2_X and the second lower voltage bus pattern BBP_VL2 to form a single pattern in a plan view without being physically separated from them. The second voltage connection lines CL_VL2 may serve to electrically connect the second horizontal voltage line VL2_X and the second lower voltage bus pattern BBP_VL2.

The second voltage connection lines CL_VL2 may be formed to protrude upward from the second lower voltage bus pattern BBP_VL2. Accordingly, the second lower voltage bus pattern BBP_VL2 may be electrically connected to the second vertical voltage lines VL2_Y disposed adjacent to the second lower voltage bus pattern BBP_VL2 in the second direction DR2.

The second lower voltage bus pattern BBP_VL2 may be spaced apart from the first lower voltage bus pattern BBP_VL1 in the first direction DR1. Similar to the first lower voltage bus pattern BBP_VL1, the second lower voltage bus pattern BBP_VL2 may not extend in a direction and may be formed as an island-shaped pattern in a plan view. Accordingly, the second lower voltage bus pattern BBP_VL2 may not overlap the first voltage connection lines CL_VL1 and/or the first lower voltage bus pattern BBP_VL1 in a plan view. The second voltage connection lines CL_VL2 may not overlap the first voltage connection lines CL_VL1 and/or the first lower voltage bus pattern BBP_VL1 in a plan view. Accordingly, this can minimize a short that may occur between the first lower voltage bus pattern BBP_VL1, the first voltage connection lines CL_VL1, the second voltage connection lines CL_VL2, and the second lower voltage bus pattern BBP_VL2 during the manufacturing process of the display device 10.

The second wiring pad PE_VL2 may be integrated with the second lower voltage bus pattern BBP_VL2 to form a single pattern. The second wiring pad PE_VL2 may protrude downward from the second lower voltage bus pattern BBP_VL2 to lie in the pad area PDA. A second pad electrode PE2 may be disposed on the second wiring pad PE_VL2. The second pad electrode PE2 may be electrically connected to the second wiring pad PE_VL2 by physically contacting the second wiring pad PE_VL2 through a second pad opening POP2. The second wiring pad PE_VL2 and the second pad electrode PE2 may form a second voltage pad electrically connected to the driving circuit DIC.

A first alignment dummy pattern DP1 may be spaced apart from the first pad electrode PE1 on the first wiring pad PE_VL1, and a second alignment dummy pattern DP2 may be spaced apart from the second pad electrode PE2 on the second wiring pad PE_VL2. An end of the first alignment dummy pattern DP1 may be disposed on the first wiring pad PE_VL1, and another end of the first alignment dummy pattern DP1 may be aligned with the lower side of the display device 10. Similarly, an end of the second alignment dummy pattern DP2 may be disposed on the second wiring pad PE_VL2, and another end of the second alignment dummy pattern DP2 may be aligned with the lower side of the display device 10. As will be described below, the first and second alignment dummy patterns DP1 and DP2 may be dummy patterns formed by partially cutting alignment connection lines for connecting alignment pads and the first and second lower voltage bus patterns BBP_VL1 and BBL_VL2 to transmit alignment signals to alignment lines in the alignment process of the light emitting elements ED during the manufacturing process of the display device 10.

Figure 4:
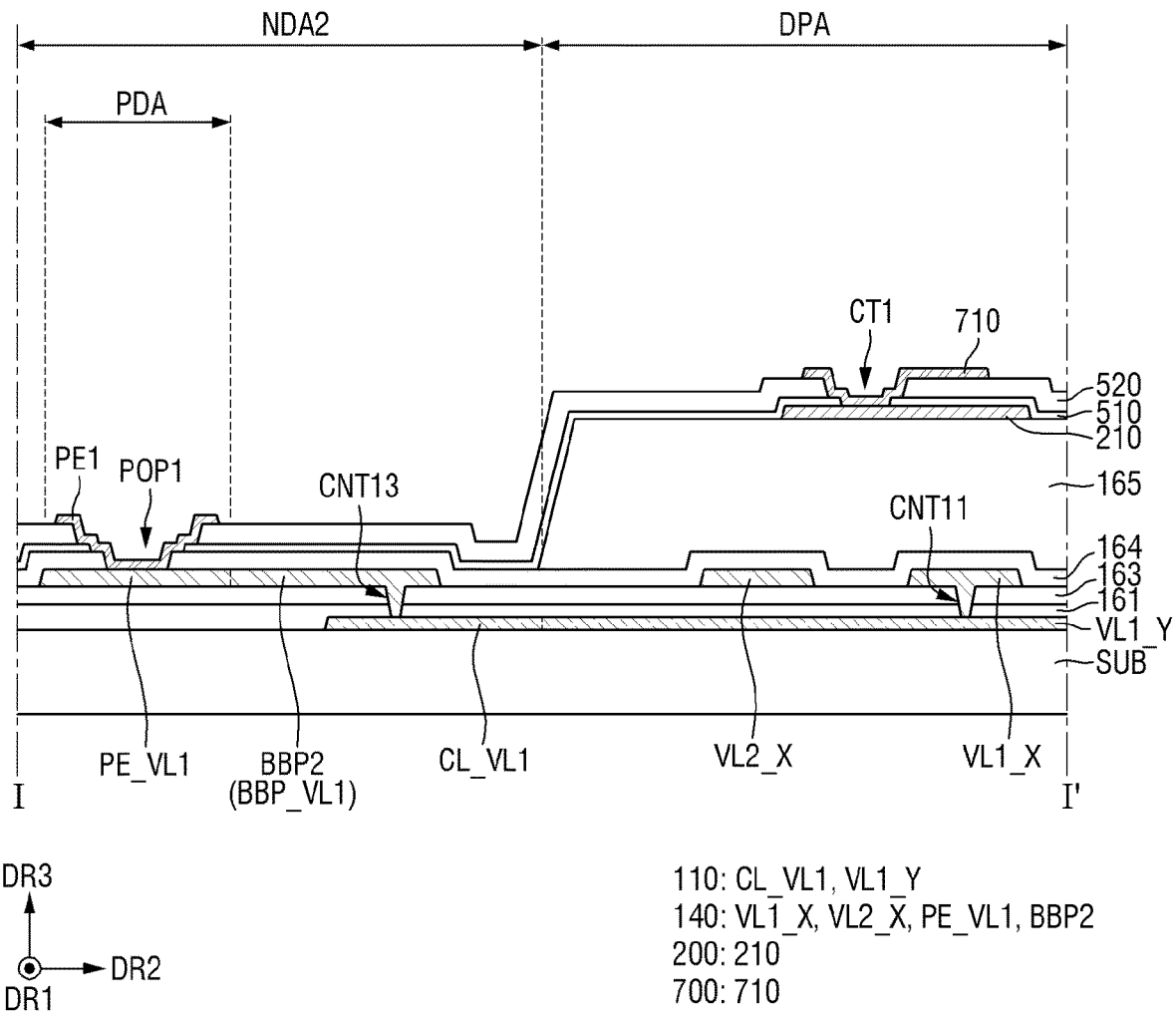
FIG. 4 is a schematic cross-sectional view of an example taken along line I-I' of FIG. 3.
Figure 5:
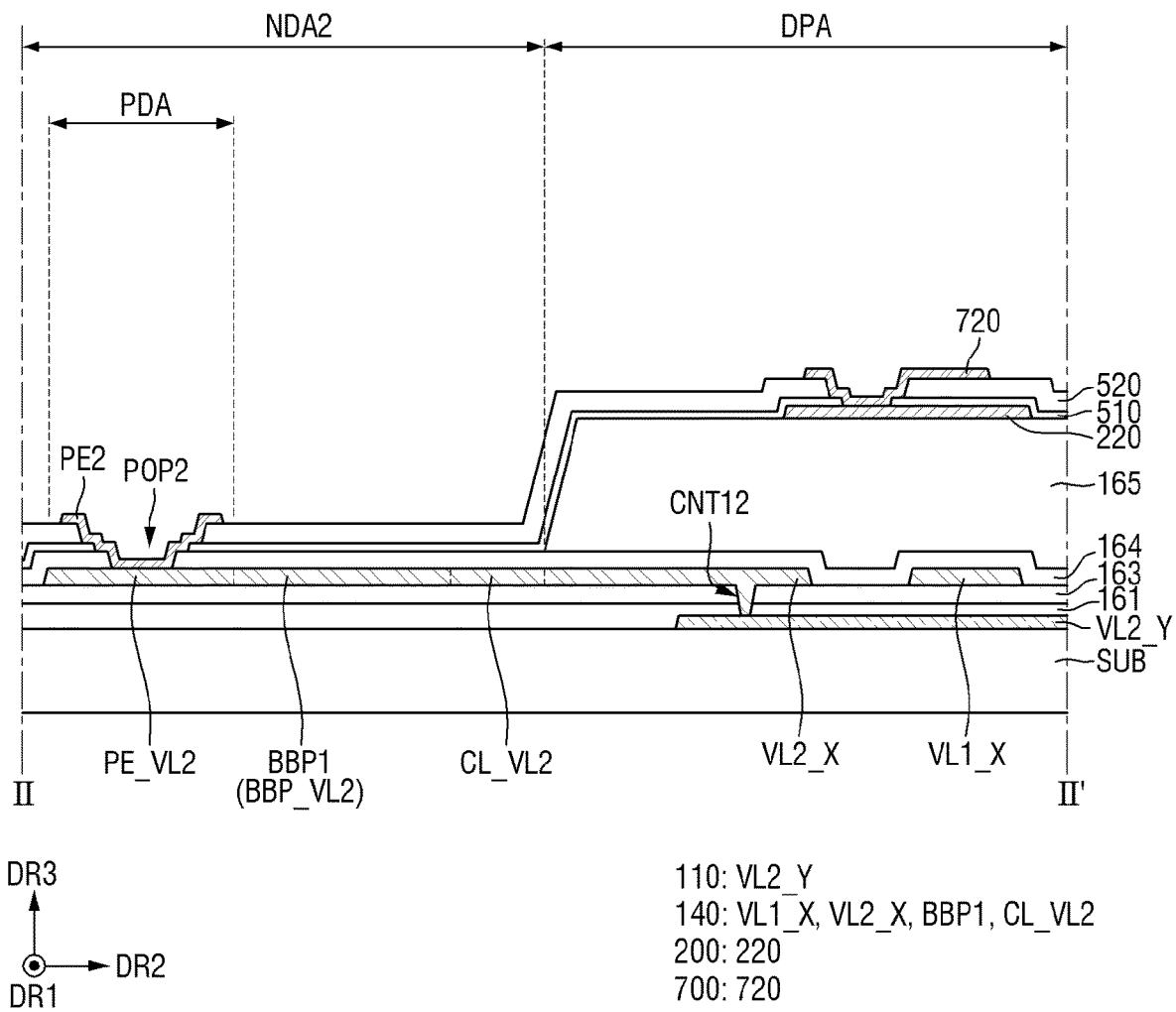
FIG. 5 is a schematic cross-sectional view of an example taken along line II-IF of FIG. 3.

FIG. 4 is a schematic cross-sectional view of an example taken along line I-I' of FIG. 3. FIG. 5 is a schematic cross-sectional view of an example taken along line II-IF of FIG. 3.

Referring to FIGS. 4 and 5, the display device 10 may include a substrate SUB, a circuit element layer disposed on the substrate SUB, and a light emitting element layer disposed on the circuit element layer.

The substrate SUB may be an insulating substrate. The substrate SUB may be made of an insulating material such as glass, quartz, or polymer resin. The substrate SUB may be a rigid substrate, but may also be a flexible substrate that can be bent, folded, rolled, etc.

The circuit element layer may be disposed on the substrate SUB. The circuit element layer may include the bottom metal layer 110, a semiconductor layer 120 (see FIG. 7), the first conductive layer 130 (see FIG. 7), the second conductive layer 140, and insulating layers.

The bottom metal layer 110 is disposed on the substrate SUB. The bottom metal layer 110 may include a first vertical voltage line VL1_Y, a first voltage connection line CL_VL1, and a second vertical voltage line VL2_Y. The bottom metal layer 110 may include a light blocking material. For example, the bottom metal layer 110 may be made of an opaque metal material that blocks transmission of light.

The first vertical voltage line VL1_Y and the second vertical voltage line VL2_Y may be disposed in the display area DPA, and the first voltage connection line CL_VL1 may be disposed in the second non-display area NDA2. The first voltage connection line CL_VL1 may extend from the first vertical voltage line VL1_Y in the direction opposite to the second direction DR2 such that the first vertical voltage line VL1_Y and the first voltage connection line CL_VL1 are integral with each other. The first voltage connection line CL_VL1 may overlap a portion of the first lower voltage bus pattern BBP_VL1 in the third direction DR3 in the second non-display area NDA2.

A buffer layer 161 may be disposed on the bottom metal layer 110. The buffer layer 161 may cover the entire surface of the substrate SUB on which the bottom metal layer 110 is disposed. The buffer layer 161 may protect transistors from moisture introduced through the substrate SUB which is vulnerable to moisture penetration.

An interlayer insulating layer 163 may be disposed on the buffer layer 161. The interlayer insulating layer 163 may cover gate electrodes GE (see FIG. 7) of the first conductive layer 130 (see FIG. 7) which will be described below. The interlayer insulating layer 163 may function as an insulating layer between the first conductive layer 130 and other layers disposed on the first conductive layer 130 and may protect the first conductive layer 130.

The second conductive layer 140 may be disposed on the buffer layer 161. The second conductive layer 140 may include a first horizontal voltage line VL1_X, a second horizontal voltage line VL2_X, a second voltage connection line CL_VL2, the first lower voltage bus pattern BBP_VL1, the second lower voltage bus pattern BBP_VL2, the first wiring pad PE_VL1, and the second wiring pad PE_VL2.

The first horizontal voltage line VL1_X may be electrically connected to the first vertical voltage line VL1_Y through a first contact hole CNT11 penetrating the buffer layer 161 and the interlayer insulating layer 163 in the display area DPA. The first horizontal voltage line VL1_X may be electrically connected to the first vertical voltage line VL1_Y by physically contacting a surface of the first vertical voltage line VL1_Y exposed by the first contact hole CNT11.

The second horizontal voltage line VL2_X may be electrically connected to the second vertical voltage line VL2_Y through a second contact hole CNT12 penetrating the buffer layer 161 and the interlayer insulating layer 163 in the display area DPA. The second horizontal voltage line VL2_X may be electrically connected to the second vertical voltage line VL2_Y by physically contacting a surface of the second vertical voltage line VL2_Y exposed by the second contact hole CNT12.

The first lower voltage bus pattern BBP_VL1 may be electrically connected to the first voltage connection line CL_VL1 through a third contact hole CNT13 penetrating the buffer layer 161 and the interlayer insulating layer 163 in the second non-display area NDA2. The first lower voltage bus pattern BBP_VL1 may be electrically connected to the first voltage connection line CL_VL1 by physically contacting a surface of the first voltage connection line CL_VL1 exposed by the third contact hole CNT13. Accordingly, the first lower voltage bus pattern BBP_VL1 and the first vertical voltage line VL1_Y may be electrically connected through the first voltage connection line CL_VL1.

The second lower voltage bus pattern BBP_VL2, the second voltage connection line CL_VL2, and the second horizontal voltage line VL2_X disposed adjacent to the second voltage connection line CL_VL2 may be integrated to form a single pattern.

The first wiring pad PE_VL1 may extend from the first lower voltage bus pattern BBP_VL1 to lie in the pad area PDA. The second wiring pad PE_VL2 may extend from the second lower voltage bus pattern BBP_VL2 to lie in the pad area PDA. Upper surfaces of the first wiring pad PE_VL1 and the second wiring pad PE_VL2 disposed in the pad area PDA may be at least partially exposed by the first pad opening POP1 and the second pad opening POP2, respectively.

A passivation layer 164 may be disposed on the second conductive layer 140. The passivation layer 164 may cover the second conductive layer 140. The passivation layer 164 may expose at least a portion of each of the first wiring pad PE_VL1 and the second wiring pad PE_VL2 in the pad area PDA. The passivation layer 164 may protect the second conductive layer 140.

A via layer 165 may be disposed on the passivation layer 164. The via layer 165 may be disposed in the display area DPA. The via layer 165 may include an organic insulating material, for example, an organic material such as polyimide (PI). The via layer 165 may perform a surface planarization function. Therefore, an upper surface (or a surface) of the via layer 165 on which the light emitting element layer to be described below is disposed may be generally flat regardless of the shape or presence of a pattern disposed thereunder.

The light emitting element layer may be disposed on the circuit element layer. The light emitting element layer may be disposed on the via layer 165. The light emitting element layer may include an electrode layer 200, a first insulating layer 510, a second insulating layer 520, and contact electrodes 700.

The electrode layer 200 may be disposed in the display area DPA. The electrode layer 200 may include a first electrode 210 and a second electrode 220. The electrode layer 200 may be disposed on the via layer 165.

The first insulating layer 510 may be disposed on the electrode layer 200. The first insulating layer 510 may expose at least a portion of each of the first electrode 210 and the second electrode 220 in the display area DPA. The first insulating layer 510 may expose at least a portion of each of the first wiring pad PE_VL1 and the second wiring pad PE_VL2 together with the passivation layer 164 in the pad area PDA.

The second insulating layer 520 may be disposed on the first insulating layer 510. The second insulating layer 520 may expose at least a portion of each of the first electrode 210 and the second electrode 220 together with the first insulating layer 510 in the display area DPA. For example, the second insulating layer 520 may form a first contact portion CT1 exposing at least a portion of the first electrode 210 and a second contact portion CT2 exposing at least a portion of the second electrode 220 together with the first insulating layer 510 in the display area DPA.

The second insulating layer 520 may expose at least a portion of each of the first wiring pad PE_VL1 and the second wiring pad PE_VL2 together with the first insulating layer 510 in the pad area PDA. For example, the second insulating layer 520 may form the first pad opening POP1 exposing at least a portion of the first wiring pad PE_VL1 and the second pad opening POP2 exposing at least a portion of the second wiring pad PE_VL2 together with the first insulating layer 510 and the passivation layer 164 in the pad area PDA.

The contact electrodes 700 may be disposed on the second insulating layer 520 in the display area DPA. The contact electrodes 700 may include a first contact electrode 710 and a second contact electrode 720.

The first contact electrode 710 may be disposed on the first electrode 210. The first contact electrode 710 may be electrically connected to the first electrode 210 through the first contact portion CT1 penetrating the first insulating layer 510 and the second insulating layer 520. The first contact electrode 710 may be electrically connected to the first electrode 210 by contacting an upper surface of the first electrode 210 exposed by the first contact portion CT1.

The second contact electrode 720 may be disposed on the second electrode 220. The second contact electrode 720 may be electrically connected to the second electrode 220 through the second contact portion CT2 penetrating the first insulating layer 510 and the second insulating layer 520. The second contact electrode 720 may be electrically connected to the second electrode 220 by contacting an upper surface of the second electrode 220 exposed by the second contact portion CT2.

In an embodiment, the first contact electrode 710 and the second contact electrode 720 may include a same material and may be formed on a same layer. However, the disclosure is not limited thereto, and the first contact electrode 710 and the second contact electrode 720 may also be formed on different layers.

The first pad electrode PE1 and the second pad electrode PE2 may be disposed on the second insulating layer 520 in the pad area PDA. The first pad electrode PE1 may be disposed on the first wiring pad PE_VL1. The first pad electrode PE1 may be electrically connected to the first wiring pad PE_VL1 through the first pad opening POP1 penetrating the passivation layer 164, the first insulating layer 510, and the second insulating layer 520. The first pad electrode PE1 may be electrically connected to the first wiring pad PE_VL1 by contacting the upper surface of the first wiring pad PE_VL1 exposed by the first pad opening POP1. The second pad electrode PE2 may be disposed on the second wiring pad PE_VL2. The second pad electrode PE2 may be electrically connected to the second wiring pad PE_VL2 through the second pad opening POP2 penetrating the passivation layer 164, the first insulating layer 510, and the second insulating layer 520. The second pad electrode PE2 may be electrically connected to the second wiring pad PE_VL2 by contacting the upper surface of the second wiring pad PE_VL2 exposed by the second pad opening POP2.

The first pad electrode PE1, the second pad electrode PE2, and the contact electrodes 700 may include a same material and may be formed on a same layer. In an embodiment in which the first contact electrode 710 and the second contact electrode 720 are formed on the same layer, the first pad electrode PE1 and the second pad electrode PE2 may be formed on the same layer as the first contact electrode 710 and the second contact electrode 720. In some embodiments in which the first contact electrode 710 and the second contact electrode 720 are formed on different layers, the first pad electrode PE1 and the second pad electrode PE2 may be formed on the same layer as the first contact electrode 710 and/or the second contact electrode 720.

Figure 6:
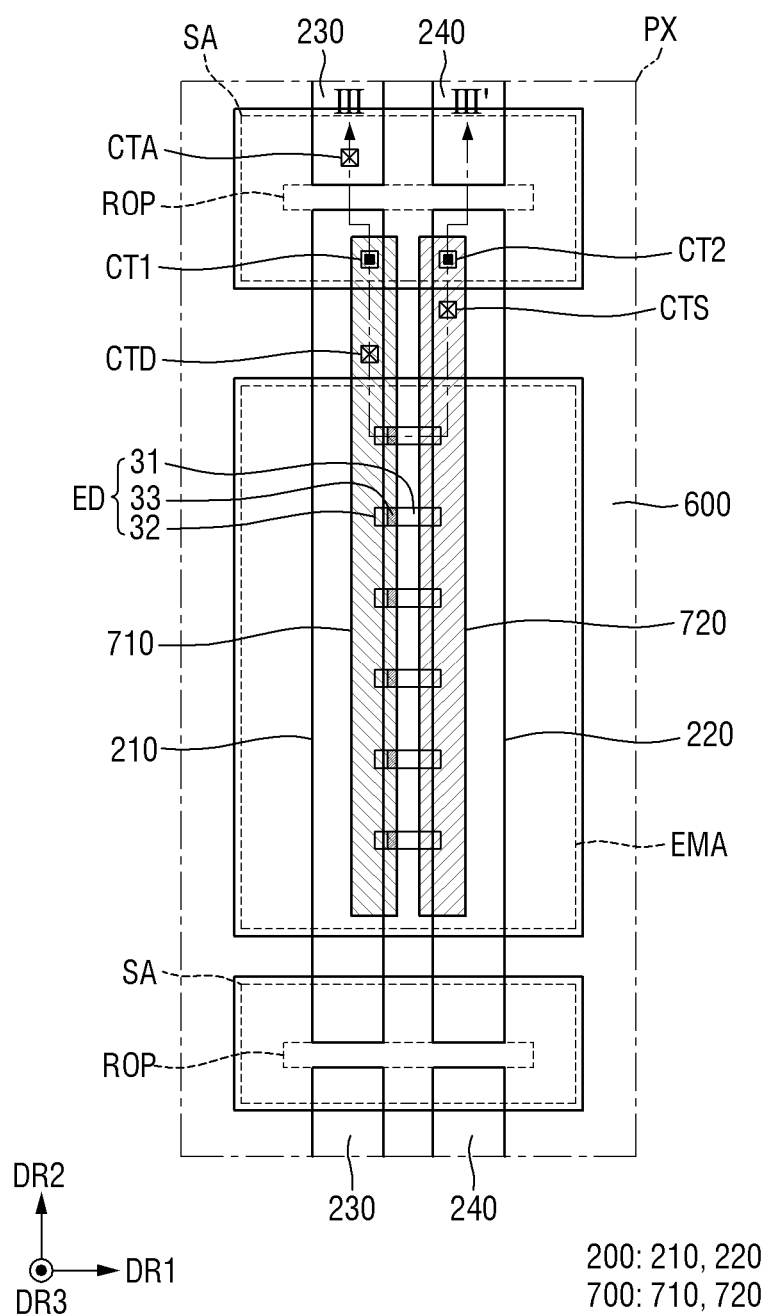
FIG. 6 is a schematic plan layout view of a pixel according to an embodiment.
Figure 7:
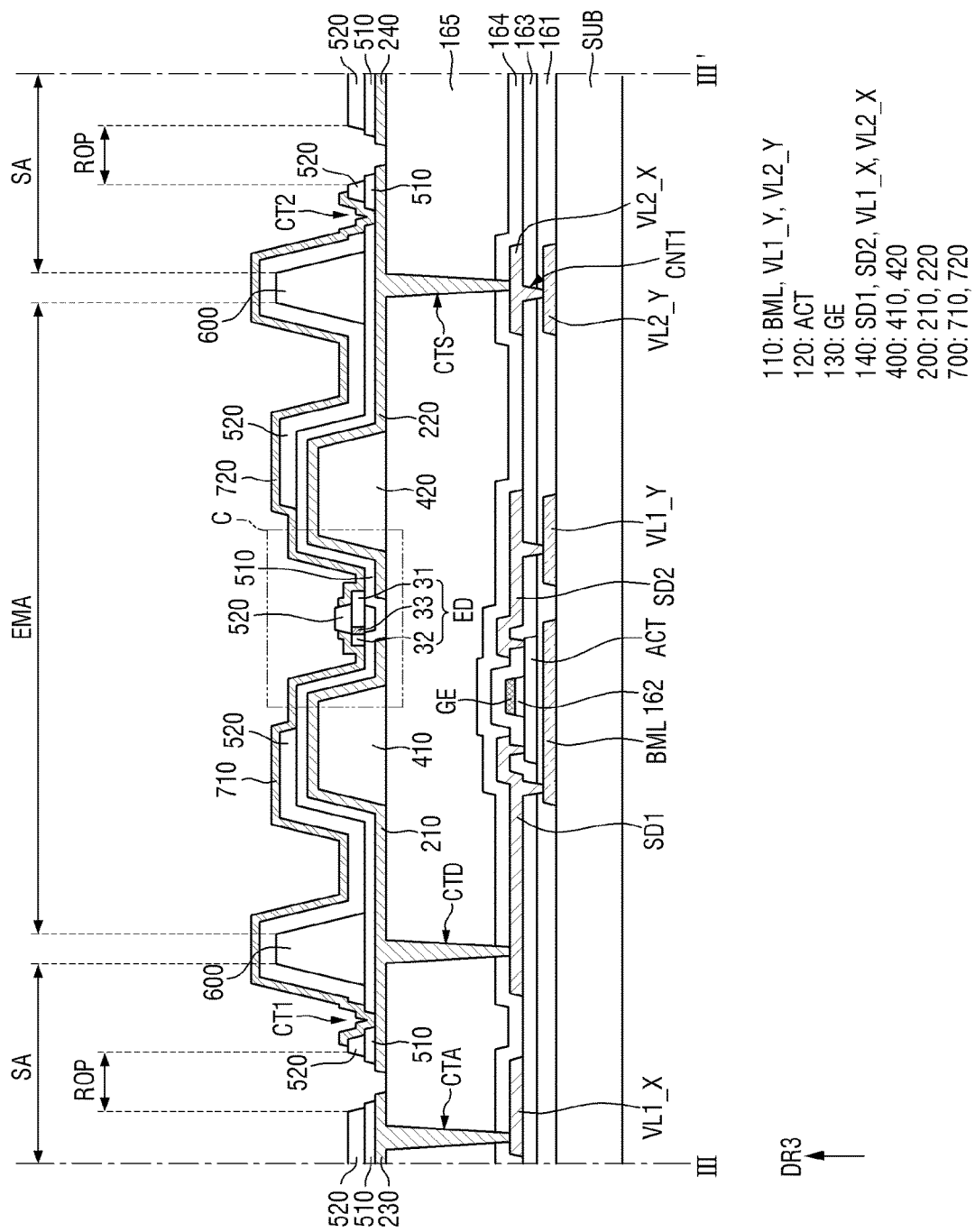
FIG. 7 is a schematic cross-sectional view of an example taken along line of FIG. 6.

FIG. 6 is a schematic plan layout view of a pixel PX according to an embodiment. FIG. 7 is a schematic cross-sectional view of an example taken along line of FIG. 6.

Referring to FIG. 6, each pixel PX of the display device 10 may include an emission area EMA and a non-emission area. The emission area EMA may be defined as an area from which light emitted from light emitting elements ED is output, and the non-emission area may be defined as an area from which light emitted from the light emitting elements ED is not output because the light emitted from the light emitting elements ED is not directed to this area.

The emission area EMA may include an area in which the light emitting elements ED are disposed and an area adjacent to this area. The emission area EMA may further include an area where light emitted from the light emitting elements ED is output after being reflected or refracted by other members.

Each pixel PX may further include a sub-area SA disposed in the non-emission area. The light emitting elements ED may not be disposed in the sub-area SA. The sub-area SA may be disposed above and below the emission area EMA in a plan view within a pixel PX. The sub-area SA may be disposed between the emission areas EMA of pixels PX neighboring each other in the second direction DR2. The sub-area SA may include an area in which an electrode layer 200 and contact electrodes 700 are electrically connected through contact portions CT1 and CT2.

The sub-area SA may include a separation portion ROP. The separation portion ROP of the sub-area SA may be an area where a first electrode 210 and a first dummy pattern 230 neighboring each other in the second direction DR2 are separated from each other and where a second electrode 220 and a second dummy pattern 240 neighboring each other in the second direction DR2 are separated from each other.

Referring to FIGS. 6 and 7, the bottom metal layer 110 may further include a light blocking pattern BML. Accordingly, the bottom metal layer 110 may include a first vertical voltage line VL1_Y, a second vertical voltage line VL2_Y, and the light blocking pattern BML. The light blocking pattern BML may be disposed under a semiconductor pattern ACT of a transistor to cover at least a channel region of the semiconductor pattern ACT. However, the disclosure is not limited thereto, and the light blocking pattern BML may also be omitted. A high potential voltage (or a first power supply voltage) supplied to the transistor may be applied to the first vertical voltage line VL1_Y, and a low potential voltage (or a second power supply voltage) lower than the high potential voltage supplied to a first voltage line VL1 may be applied to the second vertical voltage line VL2_Y.

The semiconductor layer 120 may be disposed on the buffer layer 161 disposed on the bottom metal layer 110. The semiconductor layer 120 may include the semiconductor pattern ACT of the transistor. The semiconductor pattern ACT of the transistor may overlap the light blocking pattern BML of the bottom metal layer 110.

The semiconductor layer 120 may include polycrystalline silicon, monocrystalline silicon, an oxide semiconductor, or the like. In an embodiment, in case that the semiconductor layer 120 includes polycrystalline silicon, the polycrystalline silicon may be formed by crystallizing amorphous silicon. In case that the semiconductor layer 120 includes polycrystalline silicon, the semiconductor pattern ACT of the transistor may include doping regions doped with impurities and a channel region between them. In another embodiment, the semiconductor layer 120 may include an oxide semiconductor. The oxide semiconductor may be, for example, indium-fin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), or indium-gallium-zinc-tin oxide (IGZTO).

A gate insulating layer 162 may be disposed on the semiconductor layer 120. In an embodiment, the gate insulating layer 162 may be formed in the same pattern as the first conductive layer 130 disposed thereon. Accordingly, sidewalls of the gate insulating layer 162 may be aligned with sidewalls of the gate electrode GE. However, the disclosure is not limited thereto, and the gate insulating layer 162 may also be disposed on the entire surface of the semiconductor layer 120. The gate insulating layer 162 may function as a gate insulating layer of the transistor. The gate insulating layer 162 may be a multilayer in which inorganic layers including an inorganic material, for example, at least one of silicon oxide ($SiO_x$), silicon nitride ($SiN_x$), and silicon oxynitride (SiON) are alternately stacked each other.

The first conductive layer 130 may be disposed on the gate insulating layer 162. The first conductive layer 130 may include the gate electrode GE of the transistor. The gate electrode GE may overlap the channel region of the semiconductor pattern ACT in the third direction DR3 which is the thickness direction of the substrate SUB.

The interlayer insulating layer 163 may be disposed on the first conductive layer 130. The interlayer insulating layer 163 may cover the gate electrode GE.

The second conductive layer 140 may be disposed on the interlayer insulating layer 163. The second conductive layer 140 may include a drain electrode SD2 of the transistor, a source electrode SD1 of the transistor, a first horizontal voltage line VL1_X, and a second horizontal voltage line VL2_X.

The drain electrode SD2 and the source electrode SD1 of the transistor may respectively be electrically connected to end regions of the semiconductor pattern ACT of the transistor through contact holes penetrating the interlayer insulating layer 163. The source electrode SD1 of the transistor may be electrically connected to the light blocking pattern BML of the bottom metal layer 110 through another contact hole penetrating the interlayer insulating layer 163 and the buffer layer 161, and the drain electrode SD2 of the transistor may be electrically connected to the first vertical voltage line VL1_Y of the bottom metal layer 110 through another contact hole penetrating the interlayer insulating layer 163 and the buffer layer 161.

The source electrode SD1 of the transistor may overlap the first electrode 210 of the electrode layer 200 in the third direction DR3. The source electrode SD1 of the transistor may be electrically connected to the first electrode 210 through a first electrode contact hole CTD penetrating the via layer 165 and the passivation layer 164 to be described below. The transistor may transfer the first power supply voltage received from the first vertical voltage line VL1_Y to the first electrode 210 through the source electrode SD1 of the transistor.

The first horizontal voltage line VL1_X may overlap the first dummy pattern 230 in the third direction DR3. The first horizontal voltage line VL1_X may be electrically connected to the first dummy pattern 230 through an alignment contact hole CTA penetrating the via layer 165 and the passivation layer 164. The high potential voltage supplied to the transistor may be applied to the first horizontal voltage line VL1_X.

The second horizontal voltage line VL2_X may overlap the second electrode 220 of the electrode layer 200 in the third direction DR3. The second horizontal voltage line VL2_X may be electrically connected to the second electrode 220 through a second electrode contact hole CTS penetrating the via layer 165 and the passivation layer 164. The second power supply voltage lower than the high potential voltage supplied to a first voltage line VL1 may be applied to the second horizontal voltage line VL2_X.

The passivation layer 164 may be disposed on the second conductive layer 140. The passivation layer 164 may cover the second conductive layer 140.

The via layer 165 may be disposed on the passivation layer 164. The upper surface of the via layer 165 may be generally flat regardless of the shape or presence of a pattern disposed thereunder.

The light emitting element layer may be disposed on the circuit element layer. The light emitting element layer may be disposed on the via layer 165. The light emitting element layer may include a first bank 400, the electrode layer 200, the first insulating layer 510, a second bank 600, light emitting elements ED, and the contact electrodes 700.

The first bank 400 may be disposed on the via layer 165 in the emission area EMA. The first bank 400 may be directly disposed on a surface of the via layer 165. The first bank 400 may have a structure in which at least a portion protrudes upward (e.g., a side in the third direction DR3) from the surface of the via layer 165. The protruding portion of the first bank 400 may have inclined side surfaces. The first bank 400 including the inclined side surfaces may cause light travelling toward the side surfaces of the first bank 400 after being emitted from the light emitting elements ED to travel in an upward direction (e.g., the display direction).

The first bank 400 may include a first sub-bank 410 and a second sub-bank 420 spaced apart from each other. The first sub-bank 410 and the second sub-bank 420 spaced apart from each other may provide a space in which the light emitting elements ED are disposed. The first sub-bank 410 and the second sub-bank 420 assist role of reflective barriers in changing the travelling direction of light emitted from the light emitting elements ED to the display direction.

Although the side surfaces of the first bank 400 are inclined in a linear shape in the drawings, the disclosure is not limited thereto. For example, the side surfaces (or outer surface) of the first bank 400 may have a curved semi-circular or semi-elliptical shape. In an embodiment, the first bank 400 may include an organic insulating material such as polyimide (PI), but the disclosure is not limited thereto.

The electrode layer 200 may extend in a direction and may cross the emission area EMA and the sub-area SA. The electrode layer 200 may transmit an electrical signal received from the circuit element layer to the light emitting elements ED so as to cause the light emitting elements ED to emit light. The electrode layer 200 may be utilized to generate an electric field used in an alignment process of the light emitting elements ED.

The electrode layer 200 may be disposed on the first bank 400 and the via layer 165 exposed by the first bank 400. The electrode layer 200 may be disposed on the first bank 400 in the emission area EMA and may be disposed on the via layer 165 exposed by the first bank 400 in the non-emission area.

The electrode layer 200 may include the first electrode 210 and the second electrode 220. The first electrode 210 and the second electrode 220 may be spaced apart from each other.

The first electrode 210 may be disposed on a left side of each pixel PX in a plan view. The first electrode 210 may extend in the second direction DR2 in a plan view. The first electrode 210 may cross the emission area EMA and the sub-area SA. The first electrode 210 may extend in the second direction DR2 in a plan view, but may be separated from the first dummy pattern 230 neighboring the first electrode 210 in the second direction DR2 in the separation portion ROP of the sub-area SA.

The second electrode 220 may be spaced apart from the first electrode 210 in the first direction DR1. The second electrode 220 may be disposed on a right side of each pixel PX in a plan view. The second electrode 220 may extend in the second direction DR2 in a plan view. The second electrode 220 may cross the emission area EMA and the sub-area SA. The second electrode 220 may extend in the second direction DR2 in a plan view, but may be separated from the second dummy pattern 240 neighboring the second electrode 220 in the second direction DR2 in the separation portion ROP of the sub-area SA.

In the emission area EMA, the first electrode 210 may be disposed on the first sub-bank 410, and the second electrode 220 may be disposed on the second sub-bank 420. The first electrode 210 may extend outward from the first sub-bank 410 to also lie on the via layer 165 exposed by the first sub-bank 410. Similarly, the second electrode 220 may extend outward from the second sub-bank 420 to also lie on the via layer 165 exposed by the second sub-bank 420. The first electrode 210 and the second electrode 220 may face each other in an area between the first sub-bank 410 and the second sub-bank 420. The via layer 165 may be exposed in the area where the first electrode 210 and the second electrode 220 are spaced apart to face each other.

In the sub-area SA, the first electrode 210 may be spaced apart in the second direction DR2 from the first dummy pattern 230 adjacent to the first electrode 210 in the second direction DR2 with the separation portion ROP interposed between them. Similarly, in the sub-area SA, the second electrode 220 may be spaced apart in the second direction DR2 from the second dummy pattern 240 adjacent to the second electrode 220 in the second direction DR2 with the separation portion ROP interposed between them. Therefore, in the separation portion ROP of the sub-area SA, the first electrode 210, the second electrode 220, the first dummy pattern 230, and the second dummy pattern 240 may expose the via layer 165.

The first electrode 210 may be electrically connected to the source electrode SD1 of the transistor of the circuit element layer through the first electrode contact hole CTD penetrating the via layer 165 and the passivation layer 164. The first electrode 210 may contact an upper surface of the source electrode SD1 exposed by the first electrode contact hole CTD. The transistor of the circuit element layer may be transferred a signal to the first electrode 210 through the source electrode SD1.

The second electrode 220 may be electrically connected to a second voltage line VL2 (specifically, the second horizontal voltage line VL2_X) of the circuit element layer through the second electrode contact hole CTS penetrating the via layer 165 and the passivation layer 164. The second electrode 220 may contact an upper surface of the second horizontal voltage line VL2_X exposed by the second electrode contact hole CTS. The second power supply voltage applied from the second voltage line VL2 may be transmitted to the second electrode 220.

The first dummy pattern 230 may be disposed on the via layer 165. The first dummy pattern 230 and the electrode layer 200 may include a same material and may be formed on a same layer. The first dummy pattern 230 may be spaced apart from the first electrode 210 in the second direction DR2 with the separation portion ROP interposed between them. The first dummy pattern 230 may be disposed side by side with the first electrode 210 in the second direction DR2. The first dummy pattern 230 may be formed by separating a first alignment line 210' (see FIG. 11), which is used in the alignment process of the light emitting elements ED during the manufacturing process of the display device 10, after the alignment process so that the first alignment line 210' is spaced apart from the first electrode 210.

The first dummy pattern 230 may partially overlap the first horizontal voltage line VL1_X of the second conductive layer 140. The first dummy pattern 230 may be electrically connected to a first voltage line VL1 (specifically, the first horizontal voltage line VL1_X) of the circuit element layer through the alignment contact hole CTA penetrating the via layer 165 and the passivation layer 164. Accordingly, a first alignment signal may be transmitted to the first alignment line 210' (see FIG. 11) through the first voltage line VL1 in the process of aligning the light emitting element ED during the manufacturing process of the display device 10.

Since the first dummy pattern 230 and the first electrode 210 are spaced apart from each other by the separation portion ROP, the first dummy pattern 230 electrically connected to the first voltage line VL1 may be electrically insulated from the first electrode 210 of each pixel PX.

The second dummy pattern 240 may be disposed on the via layer 165. The second dummy pattern 240 and the electrode layer 200 may include a same material and may be formed on a same layer. The second dummy pattern 240 may be spaced apart from the second electrode 220 in the second direction DR2 with the separation portion ROP interposed between them. The second dummy pattern 240 may be disposed side by side with the second electrode 220 in the second direction DR2. The second dummy pattern 240 may be formed by separating a second alignment line 220' (see FIG. 11), which is used in the alignment process of the light emitting elements ED during the manufacturing process of the display device 10, after the alignment process so that the second alignment line 220' is spaced apart from the second electrode 220. Although the second dummy pattern 240 and the second electrode 220 are illustrated in the drawings as being spaced apart from each other, they may also be formed to extend in the second direction DR2 without being separated from each other.

The electrode layer 200 may include a conductive material having high reflectivity. For example, the electrode layer 200 may include a metal such as silver (Ag), copper (Cu), or aluminum (Al) as a material having high reflectivity or may include an alloy containing aluminum (Al), nickel (Ni), or lanthanum (La). The electrode layer 200 may reflect light, which travels toward the side surfaces of the first bank 400 after being emitted from the light emitting elements ED, toward above each pixel PX.

However, the disclosure is not limited thereto, and the electrode layer 200 may further include a transparent conductive material. For example, the electrode layer 200 may include a material such as indium-tin oxide (ITO), indium-zinc oxide (IZO), or indium-tin-zinc oxide (ITZO). In some embodiments, the electrode layer 200 may have a structure in which a transparent conductive material and a metal layer having high reflectivity are each stacked in one or more layers or may be formed as a single layer including the transparent conductive material and the metal layer. For example, the electrode layer 200 may have a stacked structure of ITO/Ag/ITO, ITO/Ag/IZO, or ITO/Ag/ITZO/IZO.

The first insulating layer 510 may be disposed on the via layer 165 on which the electrode layer 200 is formed. The first insulating layer 510 may protect the electrode layer 200 while insulating the first electrode 210 and the second electrode 220 from each other.

The first insulating layer 510 may include an inorganic insulating material. For example, the first insulating layer 510 may include at least one of inorganic insulating materials such as silicon oxide ($SiO_x$), silicon nitride ($SiN_x$), silicon oxynitride ($SiO_xN_y$), aluminum oxide ($Al_xO_y$), and aluminum nitride (AlN). The first insulating layer 510 made of an inorganic material may have a surface shape that reflects the pattern shape of the electrode layer 200 disposed under the first insulating layer 510. For example, the first insulating layer 510 may have a stepped structure according to the shape of the electrode layer 200 disposed under the first insulating layer 510. The first insulating layer 510 may include a stepped structure in which a portion of an upper surface is recessed in an area where the first electrode 210 and the second electrode 220 are spaced apart from each other to face each other. Therefore, the upper surface of the first insulating layer 510 disposed on the first electrode 210 and the second electrode 220 may be at a greater height than the upper surface of the first insulating layer 510 disposed on the via layer 165 on which the first electrode 210 and the second electrode 220 are not disposed. In the specification, a relative comparison of a height of an upper surface of any layer may be made by a height measured from a flat reference surface (e.g., the upper surface of the via layer 165) without a stepped structure thereunder.

The first insulating layer 510 may include a first contact portion CT1 exposing a portion of an upper surface of the first electrode 210 and a second contact portion CT2 exposing a portion of an upper surface of the second electrode 220 in the sub-area SA. The first electrode 210 may be electrically connected to a first contact electrode 710 through the first contact portion CT1 penetrating the first insulating layer 510 in the sub-area SA, and the second electrode 220 may be electrically connected to a second contact electrode 720 through the second contact portion CT2 penetrating the first insulating layer 510 in the sub-area SA.

The second bank 600 may be disposed on the first insulating layer 510. The second bank 600 may be disposed in a grid pattern including portions extending in the first direction DR1 and the second direction DR2 in a plan view.

The second bank 600 may be disposed at the boundary of each pixel PX to separate neighboring pixels PX and separate the emission area EMA and the sub-area SA. The second bank 600 may be formed to have a greater height than the first bank 400, so that ink in which light emitting elements ED are dispersed can be sprayed into the emission area EMA without flowing to adjacent pixels PX in an inkjet printing process for aligning the light emitting elements ED during the manufacturing process of the display device 10.

Light emitting elements ED may be disposed in the emission area EMA. The light emitting elements ED may not be disposed in the sub-area SA.

The light emitting elements ED may be disposed on the first insulating layer 510 between the first sub-bank 410 and the second sub-bank 420. The light emitting elements ED may be disposed on the first insulating layer 510 between the first electrode 210 and the second electrode 220.

The light emitting elements ED may extend in a direction, and ends of each of the light emitting elements ED may be disposed on the first electrode 210 and the second electrode 220, respectively. For example, an end of each of the light emitting elements ED may be disposed on the first electrode 210, and another end of each of the light emitting elements ED may be disposed on the second electrode 220.

A length of each light emitting element ED (e.g., a length of each light emitting element ED in the first direction DR1 in the drawings) may be smaller than a smallest distance between the first sub-bank 410 and the second sub-bank 410 spaced apart from each other in the first direction DR1. The length of each light emitting element ED may be greater than a shortest distance between the first electrode 210 and the second electrode 220 spaced apart from each other in the first direction DR1. Since the distance between the first sub-bank 410 and the second sub-bank 420 in the first direction DR1 is greater than the length of each light emitting element ED and the distance between the first electrode 210 and the second electrode 220 in the first direction DR1 is smaller than the length of each light emitting element ED in the first direction DR1, ends of each light emitting element ED may be respectively disposed on the first electrode 210 and the second electrode 220 in an area between the first sub-bank 410 and the second sub-bank 420.

Each light emitting element ED may include a first semiconductor layer 31, a second semiconductor layer 32, and an element active layer 33. The first semiconductor layer 31, the element active layer 33, and the second semiconductor layer 32 may be disposed in the first direction DR1 which is a longitudinal direction of each light emitting element ED. Each light emitting element ED may be aligned between the first electrode 210 and the second electrode 220 such that a specific end at which the first semiconductor layer 31 or the second semiconductor layer 32 is located is disposed on a specific electrode.

The light emitting elements ED may be spaced apart from each other in the second direction DR2 in which the first electrode 210 and the second electrode 220 extend and may be aligned substantially parallel to each other.

The second insulating layer 520 may be disposed on the light emitting elements ED. A portion of the second insulating layer 520 may be disposed on a portion of each light emitting element ED to expose ends of the light emitting element ED. The second insulating layer 520 may partially cover an outer surface of each light emitting element ED so as not to cover an end and another end of the light emitting element ED.

A portion of the second insulating layer 520 which is disposed on the light emitting elements ED may extend in the second direction DR2 on the first insulating layer 510 in a plan view to form a linear or island-shaped pattern within each pixel PX. The second insulating layer 520 may protect the light emitting elements ED while anchoring the light emitting elements ED in the manufacturing process of the display device 10. The second insulating layer 520 may fill a space between the light emitting elements ED and the first insulating layer 510 under the light emitting elements ED.

Together with the first insulating layer 510 in the sub-area SA, the second insulating layer 520 may form the first contact portion CT1 exposing a portion of the first electrode 210 and form the second contact portion CT2 exposing a portion of the second electrode 220.

The contact electrodes 700 may be disposed on the second insulating layer 520. The contact electrodes 700 may include the first contact electrode 710 and the second contact electrode 720 spaced apart from each other.

The first contact electrode 710 may be disposed on the first electrode 210. The first contact electrode 710 may extend in the second direction DR2 on the first electrode 210. The first contact electrode 710 may contact the first electrode 210 and an end of each light emitting element ED.

The first contact electrode 710 may contact the first electrode 210 exposed by the first contact portion CT1 penetrating the first insulating layer 510 and the second insulating layer 520 in the sub-area SA and may contact an end of each light emitting element ED in the emission area EMA. For example, the first contact electrode 710 may electrically connect the first electrode 210 and an end of each light emitting element ED.

The second contact electrode 720 may be disposed on the second electrode 220. The second contact electrode 720 may extend in the second direction DR2 on the second electrode 220. The second contact electrode 720 may contact the second electrode 220 and another end of each light emitting element ED.

The second contact electrode 720 may contact the second electrode 220 exposed by the second contact portion CT2 penetrating the first insulating layer 510 and the second insulating layer 520 in the sub-area SA and may contact another end of each light emitting element ED in the emission area EMA. For example, the second contact electrode 720 may electrically connect the second electrode 220 and the another end of each light emitting element ED.

The first contact electrode 710 and the second contact electrode 720 may be spaced apart from each other on the light emitting elements ED. The first contact electrode 710 and the second contact electrode 720 may be spaced apart from each other with the second insulating layer 520 interposed between them. The first contact electrode 710 and the second contact electrode 720 may be electrically insulated from each other.

The first contact electrode 710 and the second contact electrode 720 may include a same material. For example, each of the first contact electrode 710 and the second contact electrode 720 may include a conductive material. For example, the first contact electrode 710 and the second contact electrode 720 may include ITO, IZO, ITZO, or aluminum (Al). For example, each of the first contact electrode 710 and the second contact electrode 720 may include a transparent conductive material. Since each of the first contact electrode 710 and the second contact electrode 720 includes a transparent conductive material, light emitted from the light emitting elements ED may pass through the first contact electrode 710 and the second contact electrode 720 to travel toward the first electrode 210 and the second electrode 220 and may be reflected from surfaces of the first electrode 210 and the second electrode 220.

The first contact electrode 710 and the second contact electrode 720 including a same material and may be formed of a same layer. The first contact electrode 710 and the second contact electrode 720 may be simultaneously formed through a same process.

An end of each light emitting element ED may be electrically connected to the transistor of the circuit element layer via the first contact electrode 710 and the first electrode 210, and another end of each light emitting element ED may be electrically connected to a second voltage line VL2 of the circuit element layer via the second contact electrode 720 and the second electrode 220.

Figure 8:
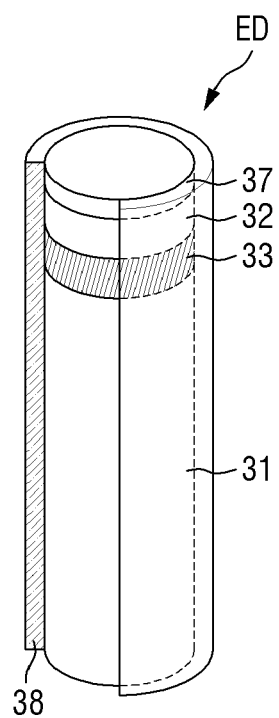
FIG. 8 is a schematic perspective view of a light emitting element according to an embodiment.

FIG. 8 is a schematic perspective view of a light emitting element ED according to an embodiment.

Referring to FIG. 8, the light emitting element ED is a particulate element and may be shaped like a rod or cylinder having an aspect ratio (e.g., a predetermined or selectable aspect ratio). A length of the light emitting element ED may be greater than a diameter of the light emitting element ED, and the aspect ratio of the light emitting element ED may be about 6:5 to about 100:1. However, the disclosure is not limited thereto.

The light emitting element ED may have a nanometer-scale size (e.g., in a range of about 1 nm to about 1 μm) or a micrometer-scale size (e.g., in a range of about 1 μm to about 1 mm). In an embodiment, the diameter and length of the light emitting element ED may have a nanometer-scale size or a micrometer-scale size. In some embodiments, the diameter of the light emitting element ED may have a nanometer-scale size, whereas the length of the light emitting element ED has a micrometer-scale size. In some embodiments, some of light emitting elements ED may have a nanometer-scale size in diameter and/or length, whereas other light emitting elements ED have a micrometer-scale size in diameter and/or length.

In an embodiment, the light emitting element ED may be an inorganic light emitting diode. The inorganic light emitting diode may include semiconductor layers. For example, the inorganic light emitting diode may include a first conductivity-type (e.g., n-type) semiconductor layer, a second conductivity-type (e.g., p-type) semiconductor layer, and an active semiconductor layer interposed between them. The active semiconductor layer may receive holes and electrons from the first conductivity-type semiconductor layer and the second conductivity-type semiconductor layer, respectively, and the holes and electrons reaching the active semiconductor layer may be combined with each other to emit light.

In case that a first alignment signal and a second alignment signal are transmitted to a first alignment line 210' (see FIG. 11) and a second alignment line 220' (see FIG. 11), respectively, the light emitting element ED may be aligned by an electric field generated between the first alignment line 210' and the second alignment line 220' such that each of the first conductivity-type semiconductor layer and the second conductivity-type semiconductor layer faces a specific alignment line 200'.

In an embodiment, the above-described semiconductor layers may be sequentially stacked each other in a direction which is the longitudinal direction of the light emitting element ED. The light emitting element ED may include a first semiconductor layer 31, an element active layer 33, and a second semiconductor layer 32 sequentially stacked each other in the direction. The first semiconductor layer 31, the element active layer 33, and the second semiconductor layer 32 may respectively be the first conductivity-type semiconductor layer, the active semiconductor layer, and the second conductivity-type semiconductor layer described above.

The first semiconductor layer 31 may be doped with a dopant of a first conductivity type. The first conductivity-type dopant may be Si, Ge, or Sn. In an embodiment, the first semiconductor layer 31 may be n-GaN doped with n-type Si.

The second semiconductor layer 32 may be spaced apart from the first semiconductor layer 31 with the element active layer 33 interposed between them. The second semiconductor layer 32 may be doped with a dopant of a second conductivity type such as Mg, Zn, Ca, Sr, or Ba. In an embodiment, the second semiconductor layer 32 may be p-GaN doped with p-type Mg.

The element active layer 33 may include a material having a single or multiple quantum well structure. As described above, the element active layer 33 may emit light through combination of electron-hole pairs according to electrical signals received through the first semiconductor layer 31 and the second semiconductor layer 32.

In some embodiments, the element active layer 33 may have a structure in which a semiconductor material having a large band gap energy and a semiconductor material having a small band gap energy are alternately stacked each other or may include different group III to V semiconductor materials depending on the wavelength band of light that it emits.

Light emitted from the element active layer 33 may be radiated not only through end surfaces of the light emitting element ED in the longitudinal direction, but also through an outer circumferential surface (or an outer surface or side surfaces) of the light emitting element ED. For example, the direction of light emitted from the element active layer 33 is not limited to a direction.

The light emitting element ED may further include an element electrode layer 37 disposed on the second semiconductor layer 32. The element electrode layer 37 may contact the second semiconductor layer 32. The element electrode layer 37 may be an ohmic contact electrode. However, the disclosure is not limited thereto, and the element electrode layer 37 may also be a Schottky contact electrode.

In case that ends of the light emitting element ED are electrically connected to the contact electrodes 700 to transmit electrical signals to the first semiconductor layer 31 and the second semiconductor layer 32, the element electrode layer 37 may be disposed between the second semiconductor layer 32 and the contact electrodes 700 to reduce the resistance between them. The element electrode layer 37 may include at least one of aluminum (Al), titanium (Ti), indium (In), gold (Au), silver (Ag), indium-tin oxide (ITO), indium-zinc oxide (IZO), indium-tin-zinc oxide (ITZO), etc. The element electrode layer 37 may also include an n-type or p-type doped semiconductor material.

The light emitting element ED may further include an element insulating film 38 covering outer circumferential surfaces of the first semiconductor layer 31, the second semiconductor layer 32, the element active layer 33, and/or the element electrode layer 37. The element insulating film 38 may surround an outer surface of at least the element active layer 33 and extend in the direction in which the light emitting element ED extends. The element insulating film 38 may protect the above members. The element insulating film 38 may be made of an insulating material to prevent an electrical short circuit that may occur in case that the element, active layer 33 directly contacts an electrode that transmits an electrical signal to the light emitting element ED. Since the element insulating film 38 protects the outer circumferential surfaces of the first and second semiconductor layers 31 and 32 as well as the element active layer 33, a reduction in luminous efficiency can be prevented.

Figure 9:
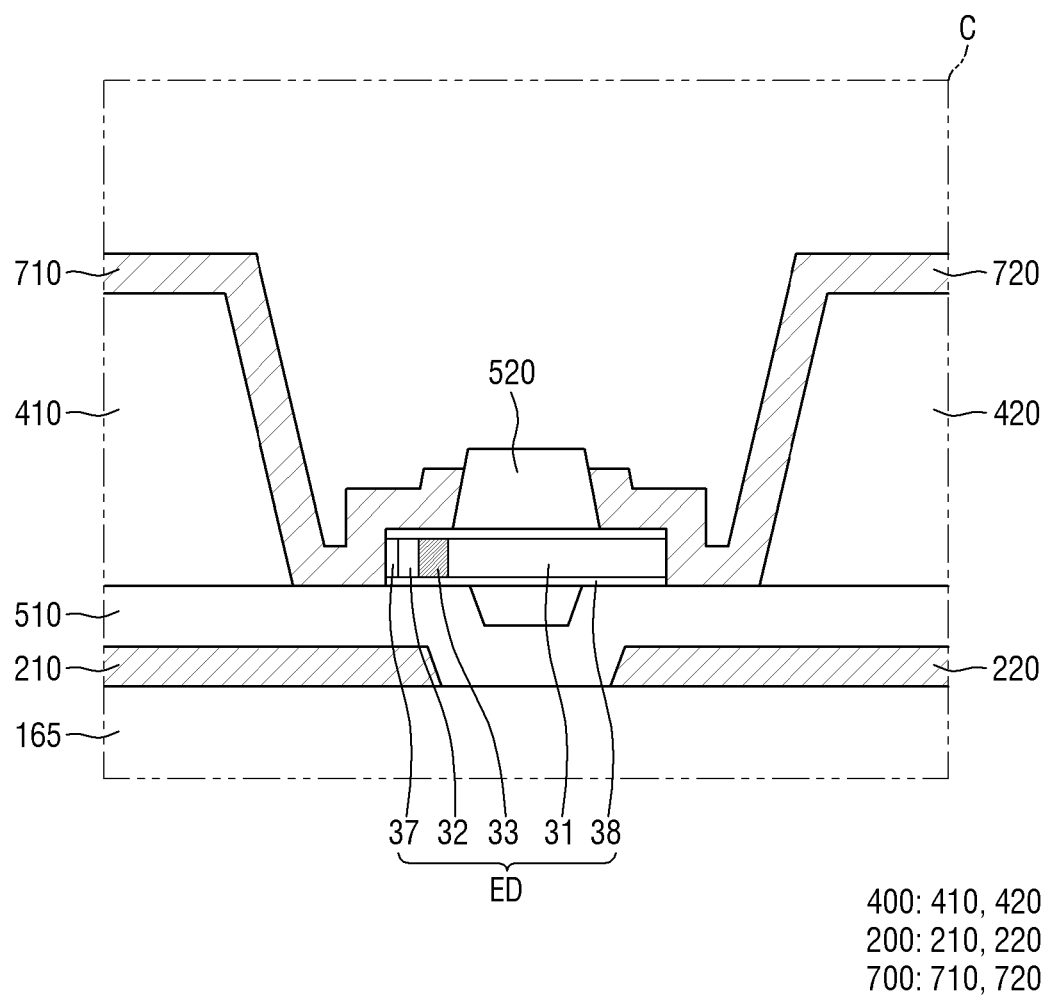
FIG. 9 is an enlarged cross-sectional view of area C of FIG. 7.

FIG. 9 is a schematic enlarged cross-sectional view of area C of FIG. 7.

Referring to FIGS. 7 and 9, a light emitting element ED may be disposed such that the extending direction of the light emitting element ED is parallel to a surface of the via layer 165. Semiconductor layers included in the light emitting element ED may be sequentially disposed in a direction parallel to the upper surface of the via layer 165. For example, the first semiconductor layer 31, the element active layer 33, the second semiconductor layer 32, and the element electrode layer 37 of the light emitting element ED may be sequentially disposed to be parallel to the upper surface of the via layer 165.

In a cross-sectional view across ends of the light emitting element ED, the first semiconductor layer 31, the element active layer 33, the second semiconductor layer 32, and the element electrode layer 37 may be sequentially formed in a direction horizontal to the upper surface of the via layer 165.

The light emitting element ED may be disposed such that an end lies on the first electrode 210 and another end lies on the second electrode 220. However, the disclosure is not limited thereto, and the light emitting element ED may also be disposed such that an end lies on the second electrode 220 and another end lies on the first electrode 210.

The second insulating layer 520 may be disposed on the light emitting element ED. The second insulating layer 520 may surround the outer surface of the light emitting element ED. The second insulating layer 520 may be disposed on the element insulating film 38 of the light emitting element ED and may surround an outer surface of the element insulating film 38 of the light emitting element ED which faces the display direction (DR3).

In an area where the light emitting element ED is disposed, the second insulating layer 520 may surround the outer surface of the light emitting element ED (specifically, the element insulating film 38 of the light emitting element ED). In an area where the light emitting element ED is not disposed, the second insulating layer 520 may be disposed on the first insulating layer 510 exposed by the light emitting element ED.

The first contact electrode 710 may contact an end of the light emitting element ED exposed by the second insulating layer 520. The first contact electrode 710 may cover an end surface of the light emitting element ED exposed by the second insulating layer 520. The first contact electrode 710 may contact the element insulating film 38 and the element electrode layer 37 of the light emitting element ED.

The second contact electrode 720 may contact another end of the light emitting element ED exposed by the second insulating layer 520. The second contact electrode 720 may cover another end surface of the light emitting element ED exposed by the second insulating layer 520. The second contact electrode 720 may contact the element insulating film 38 and the first semiconductor layer 31 of the light emitting element ED.

The first contact electrode 710 and the second contact electrode 720 may be spaced apart from each other with the second insulating layer 520 interposed between them. The first contact electrode 710 and the second contact electrode 720 may expose at least a portion of an upper surface of the second insulating layer 520.

The first contact electrode 710 and the second contact electrode 720 may be formed on a same layer and may include a same material. For example, the first contact electrode 710 and the second contact electrode 720 may be simultaneously formed in a mask process. Therefore, since an additional mask process for forming the first contact electrode 710 and the second contact electrode 720 is not required, the efficiency of the manufacturing process of the display device 10 can be improved.

Figure 10:
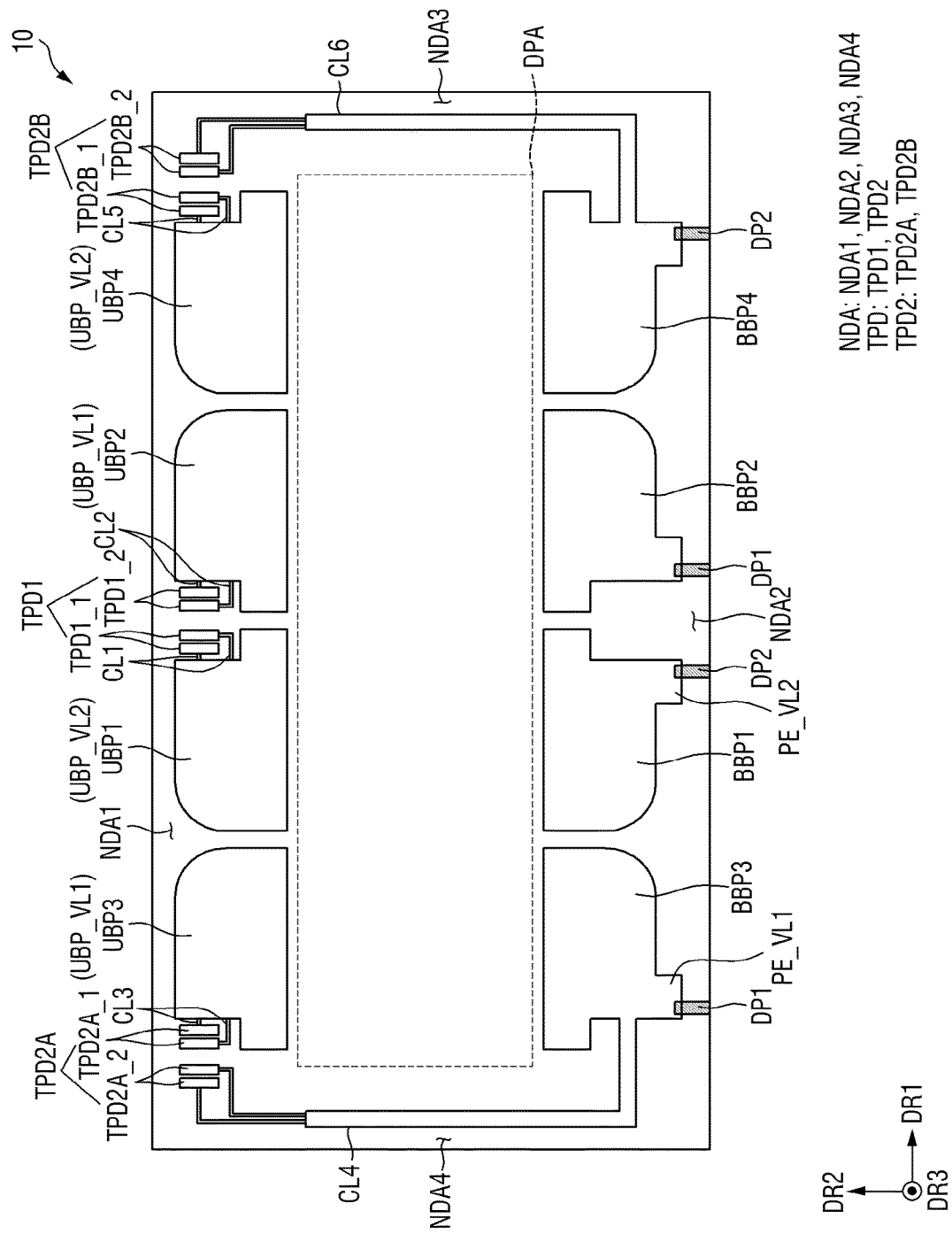
FIG. 10 is a schematic plan layout view illustrating bus patterns, test pads, and alignment dummy patterns included in the display device according to the embodiment.

FIG. 10 is a schematic plan layout view illustrating bus patterns, test pads, and alignment dummy patterns included in the display device 10 according to the embodiment.

Referring to FIGS. 2 and 10, a first test pad TPD1 may include first sub-test pads TPD1_1 connected to a first upper bus pattern UBP1 and second sub-test pads TPD1_2 connected to a second upper bus pattern UBP2. The first sub-test pads TPD1_1 may be connected to the first upper bus pattern UBP1 through first connection lines CL1, and the second sub-test pads TPD1_2 may be connected to the second upper bus pattern UBP2 through second connection lines CL2. As described above, the first upper bus pattern UBP1 may be a second upper voltage bus pattern UBP_VL2 connected to second voltage lines VL2, and the second upper bus pattern UBP2 may be a first upper voltage bus pattern UBP_VL1 connected to first voltage lines VL1. For example, the first sub-test pads TPD1_1 and the second sub-test pads TPD1_2 constituting the first test pad TPD1 may be connected to different upper voltage bus patterns, respectively. Accordingly, the first test pad TPD1 may be a short test pattern TPD1 that tests whether a short has occurred between the first voltage lines VL1 and the second voltage lines VL2 or between first alignment lines 210' and second alignment lines 220' to be described below. In other words, the first test pad TPD1 may be a short test pad TPD1 that tests whether a short has occurred between different voltage lines or different alignment lines.

In an embodiment, first sub-test pads TPD1_1 connected to the first upper bus pattern UBP1 and second sub-test pads TPD1_2 connected to the second upper bus pattern UBP2 may be provided. For example, the first sub-test pads TPD1_1 connected to the first upper bus pattern UBP1 may be two first sub-test pads TPD1_1 spaced apart from each other, and the second sub-test pads TPD1_2 connected to the second upper bus pattern UBP2 may be two second sub-test pads TPD1_2 spaced apart from each other. Since the first and second sub-test pads TPD1_1 and TPD1_2 are each formed as two sub-test pads spaced apart from each other, even if a defect occurs in one of the two sub-test pads, a test can be performed using the other sub-test pad. However, the disclosure is not limited thereto, and the first and second sub-test pads TPD1_1 and TPD1_2 each may also be one or three or more sub-test pads.

A second test pad TPD2 may include a first voltage open test pad TPD2A connected to a third upper bus pattern UBP3 and a third lower bus pattern BBP3 and a second voltage open test pad TPD2B connected to a fourth upper bus pattern UBP4 and a fourth lower bus pattern BBP4.

The first voltage open test pad TPD2A may include third sub-test pads TPD2A_1 and fourth sub-test pads TPD2A_2. The third sub-test pads TPD2A_1 may be connected to the third upper bus pattern UBP3 through third connection lines CL3, and the fourth sub-test pads TPD2A_2 may be connected to the third lower bus pattern BBP3 through a fourth connection line CL4. As described above, the third upper bus pattern UBP3 may be a first upper voltage bus pattern UBP_VL1 connected to first voltage lines VL1, and the third lower bus pattern BBP3 may be a first lower voltage bus pattern BBP_VL1 connected to the first voltage lines VL1. The third sub-test pads TPD2A_1 and the fourth sub-test pads TPD2A_2 constituting the first voltage open test pad TPD2A may be connected to same voltage bus patterns, and specifically, may be connected to first voltage bus patterns BP_VL1. Accordingly, the first voltage open test pad TPD2A may be an open test pad TPD2 that tests whether the first voltage lines VL1 or first alignment lines 210' are open. In other words, the first voltage open test pad TPD2A may be an open test pad TPD2 that tests whether same voltage lines or alignment lines are open.

A second voltage open test pad TPD2B may include fifth sub-test pads TPD2B_1 and sixth sub-test pads TPD2B_2. The fifth sub-test pads TPD2B_1 may be connected to the fourth upper bus pattern UBP4 through fifth connection lines CL5, and the sixth sub-test pads TPD2B_2 may be connected to the fourth lower bus pattern BBP4 through a sixth connection line CL6. As described above, the fourth upper bus pattern UBP4 may be a second upper voltage bus pattern UBP_VL2 connected to second voltage lines VL2, and the fourth lower bus pattern BBP4 may be a second lower voltage bus pattern BBP_VL2 connected to the second voltage lines VL2. The fifth sub-test pads TPD2B_1 and the sixth sub-test pads TPD2B_2 constituting the second voltage open test pad TPD2B may be connected to same voltage bus patterns, and specifically, may be connected to second voltage bus patterns BP_VL2. Accordingly, the second voltage open test pad TPD2B may be an open test pad TPD2 that tests whether the second voltage lines VL2 or second alignment lines 220' are open. In other words, the second voltage open test pad TPD2B may be an open test pad TPD2 that tests whether same voltage lines or alignment lines are open.

The third to sixth sub-test pads TPD2A_1, TPD2A_2, TPD2B_1, and TPD2B_2 may each be provided in plural numbers. For example, the third to sixth sub-test pads TPD2A_1, TPD2A_2, TPD2B_1, and TPD2B_2 may each be two sub-test pads spaced apart from each other. Since the third to sixth sub-test pads TPD2A_1, TPD2A_2, TPD2B_1, and TPD2B_2 are each formed as two sub-test pads, even if a defect occurs in one of the two sub-test pads, a test can be performed using the other sub-test pad.

A method of manufacturing the display device 10 described above and a method of testing the display device 10 will now be described.

FIGS. 11 to 21 are schematic process plan views illustrating a method of manufacturing a display device and a method of testing the display device according to an embodiment.

Figure 11:
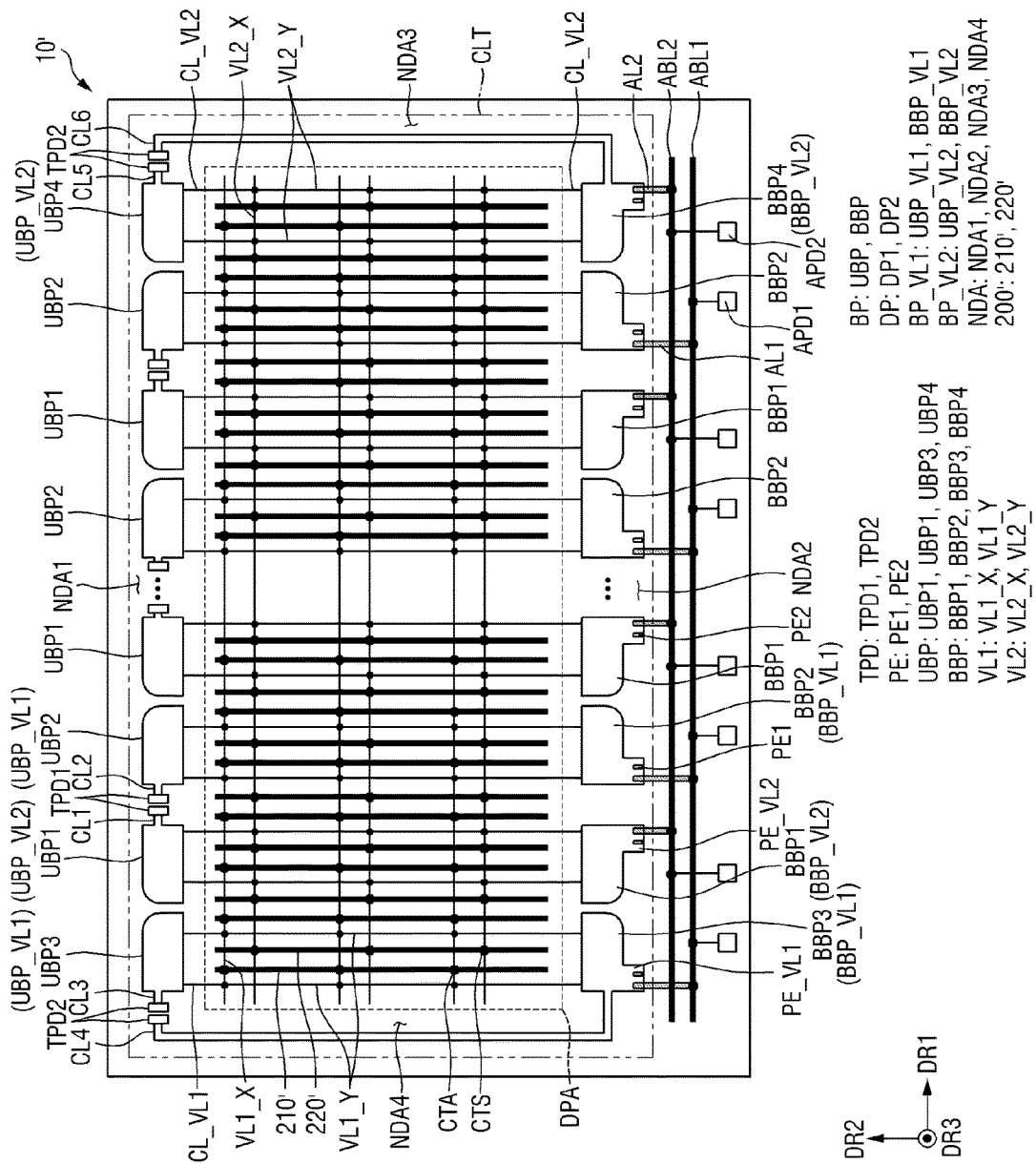
FIGS. 11 through 21 are schematic process plan views illustrating a method of manufacturing a display device and a method of testing the display device according to an embodiment.

First, referring to FIG. 11, a mother substrate 10' for a display device 10 is prepared.

The mother substrate 10' for the display device 10 may include a cell area which corresponds to the display device 10 described above and a cell peripheral area which surrounds the cell area and in which alignment pads APD1 and APD2 for an alignment process of light emitting elements ED are disposed. The cell area and the cell peripheral area may be defined by a cutting line CLT.

The mother substrate 10' for the display device 10 may include first voltage lines VL1, second voltage lines VL2, first voltage bus patterns BP_VL1, second voltage bus patterns BP_VL2, first wiring pads PE_VL1, second wiring pads PE_VL2, alignment lines 200', first and second test pads TPD1 and TPD2, and first to sixth connection lines CL1 to CL6 disposed in the cell area.

The mother substrate 10' for the display device 10 may include a first alignment bus line ABL1, a second alignment bus line ABL2, first alignment pads APD1, and second alignment pads APD2 disposed in the cell peripheral area. The mother substrate 10' for the display device 10 may further include first alignment connection lines AL1 disposed in the cell peripheral area and connecting first lower voltage bus patterns BBP_VL1 and the first alignment bus line ABL1 and second alignment connection lines AL2 disposed in the cell peripheral area and connecting second lower voltage bus patterns BBP_VL2 and the second alignment bus line ABL2.

The first alignment bus line ABL1, the second alignment bus line ABL2, the first alignment pads APD1, the second alignment pads APD2, the first alignment connection lines AL1, and the second alignment connection lines AL2 may be disposed adjacent to a second non-display area NDA2 of the cell area. For example, the first alignment bus line ABL1, the second alignment bus line ABL2, the first alignment pads APD1, the second alignment pads APD2, the first alignment connection lines AL1, and the second alignment connection lines AL2 may be disposed adjacent to a lower side of the mother substrate 10' for the display device 10. The first and second test pads TPD1 and TPD2 may be formed on a side opposite a side of the mother substrate 10' on which alignment bus lines and alignment pads for the alignment process are disposed. In case that the alignment bus lines ABL1 and ABL2 and the alignment pads APD1 and APD2 are formed on the lower side of the mother substrate 10', the first and second test pads TPD1 and TPD2 may be formed on an upper side of the mother substrate 10'. However, the disclosure is not limited thereto, and the first and second test pads TPD1 and TPD2 may also be formed on the upper and lower sides of the mother substrate 10', respectively.

Although the alignment bus lines ABL1 and ABL2 and the alignment pads APD1 and APD2 are illustrated in the drawings as being formed only on the lower side of the mother substrate 10', the disclosure is not limited thereto. For example, the alignment bus lines ABL1 and ABL2 and the alignment pads APD1 and APD2 may also be formed on each of the upper and lower sides of the mother substrate 10' or may also be formed on each of the upper, lower, right and left sides of the mother substrate 10'. A probe used in the alignment process may transmit an alignment signal to pad electrodes formed on each side.

The first alignment bus line ABL1 and the second alignment bus line ABL2 may be disposed between lower bus patterns BBP and the first and second alignment pads APD1 and APD2. The first alignment bus line ABL1 and the second alignment bus line ABL2 may extend in the first direction DR1 and may be spaced apart from each other in the second direction DR2.

The first alignment pads APD1 may be connected to the first alignment bus line ABL1, and the second alignment pads APD2 may be connected to the second alignment bus line ABL2. The first alignment bus line ABL1 may be electrically connected to the first lower voltage bus patterns BBP_VL1 through the first alignment connection lines AL1, and the second alignment bus line ABL2 may be electrically connected to the second lower voltage bus patterns BBP_VL2 through the second alignment connection lines AL2. Accordingly, a first alignment signal transmitted through the first alignment pads APD1 may be transmitted to the first lower voltage bus patterns BBP_VL1 via the first alignment bus line ABL1 and the first alignment connection lines AL1. A second alignment signal transmitted through the second alignment pads APD2 may be transmitted to the second lower voltage bus patterns BBP_VL2 via the second alignment bus line ABL2 and the second alignment connection lines AL2.

The alignment lines 200' may be disposed in a display area DPA. The alignment lines 200' may extend in the second direction DR2 in the display area DPA and may include first alignment lines 210' and second alignment lines 220' spaced apart from each other in the first direction DR1.

The first alignment lines 210' may correspond to first electrodes 210 or first dummy patterns 230 of the display device 10, and the second alignment lines 220' may correspond to second electrodes 220 or second dummy patterns 240 of the display device 10.

The first alignment lines 210' may be electrically connected to the first voltage lines VL1. The first alignment lines 210' may be electrically connected to first horizontal voltage lines VL1_X through alignment contact holes CTA penetrating the via layer 165 and the passivation layer 164 described above with reference to FIG. 7.

The second alignment lines 220' may be electrically connected to the second voltage lines VL2. The second alignment lines 220' may be electrically connected to second horizontal voltage lines VL2_X through second electrode contact holes CTS penetrating the via layer 165 and the passivation layer 164 described above with reference to FIG. 7.

Accordingly, the first alignment signal transmitted through the first alignment pads APD1 may be transmitted to the first lower voltage bus patterns BBP_VL1 via the first alignment bus line ABL1 and the first alignment connection lines AL1 and transferred to the first alignment lines 210' through the first voltage lines VL1 arranged in a mesh structure in the display area DPA. The second alignment signal transmitted through the second alignment pads APD2 may be transmitted to the second lower voltage bus patterns BBP_VL2 via the second alignment bus line ABL2 and the second alignment connection lines AL2 and transferred to the second alignment lines 220' through the second voltage lines VL2 arranged in a mesh structure in the display area DPA.

Figure 12:
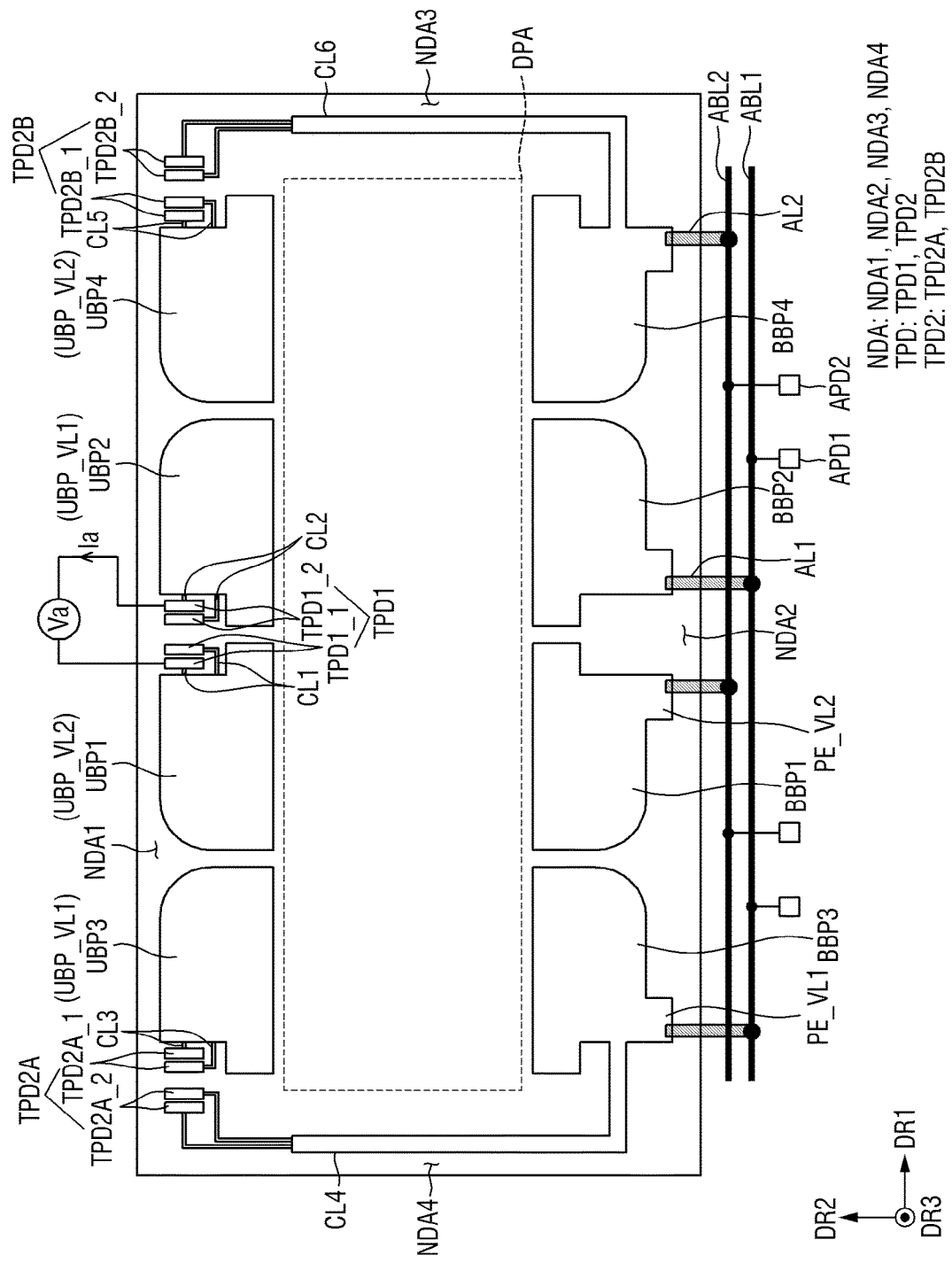

Referring to FIG. 12, it is tested whether a short has occurred between the first and second alignment lines 210' and 220' using the first test pads TPD1. In this short test, it may be tested not only whether a short has occurred between the first and second alignment lines 210' and 220', but also whether a short has occurred between the first and second voltage lines VL1 and VL2.

A first test current Ia is measured by applying a first test voltage Va to ends of first and second sub-test pads TPD1_1 and TPD1_2 of a first test pad TPD1. Test resistance is calculated using the first test voltage Va and the measured first test current Ia. It is determined whether a short has occurred between first and second alignment lines 210' and 220' using a difference between the calculated test resistance and threshold resistance.

Figure 13:
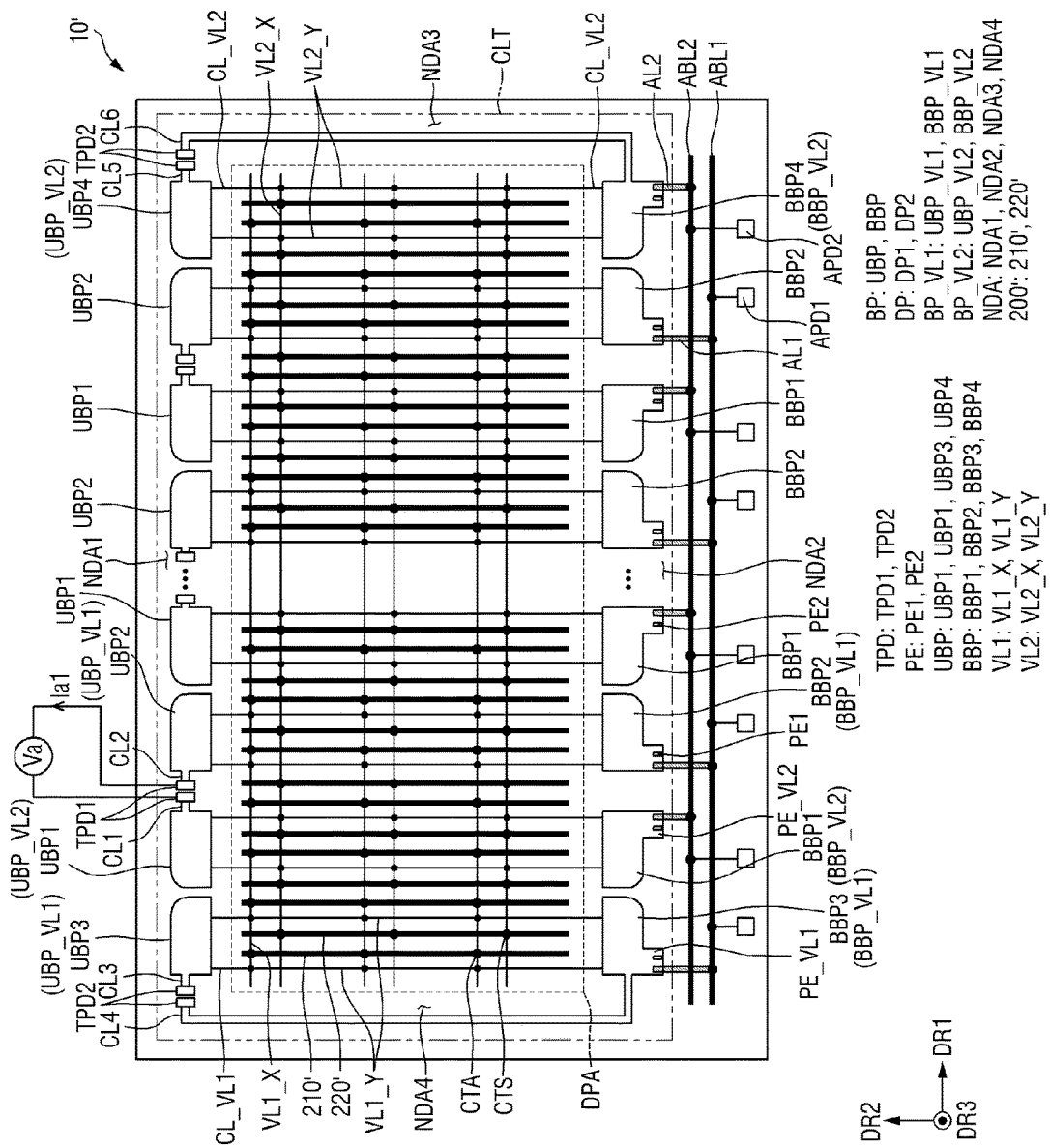

For example, referring to FIG. 13, in case that the first test voltage Va is applied using a first test pad TPD1, a first test current Ia1 may be measured. If first and second alignment lines 210' and 220' of the mother substrate 10' for the display device 10 are patterned normally, a difference between resistance calculated using the first test voltage Va and the first test current Ia1 and the threshold resistance may be equal to or less than a reference value. It may be determined that a short has not occurred between the first and second alignment lines 210' and 220'.

Figure 14:
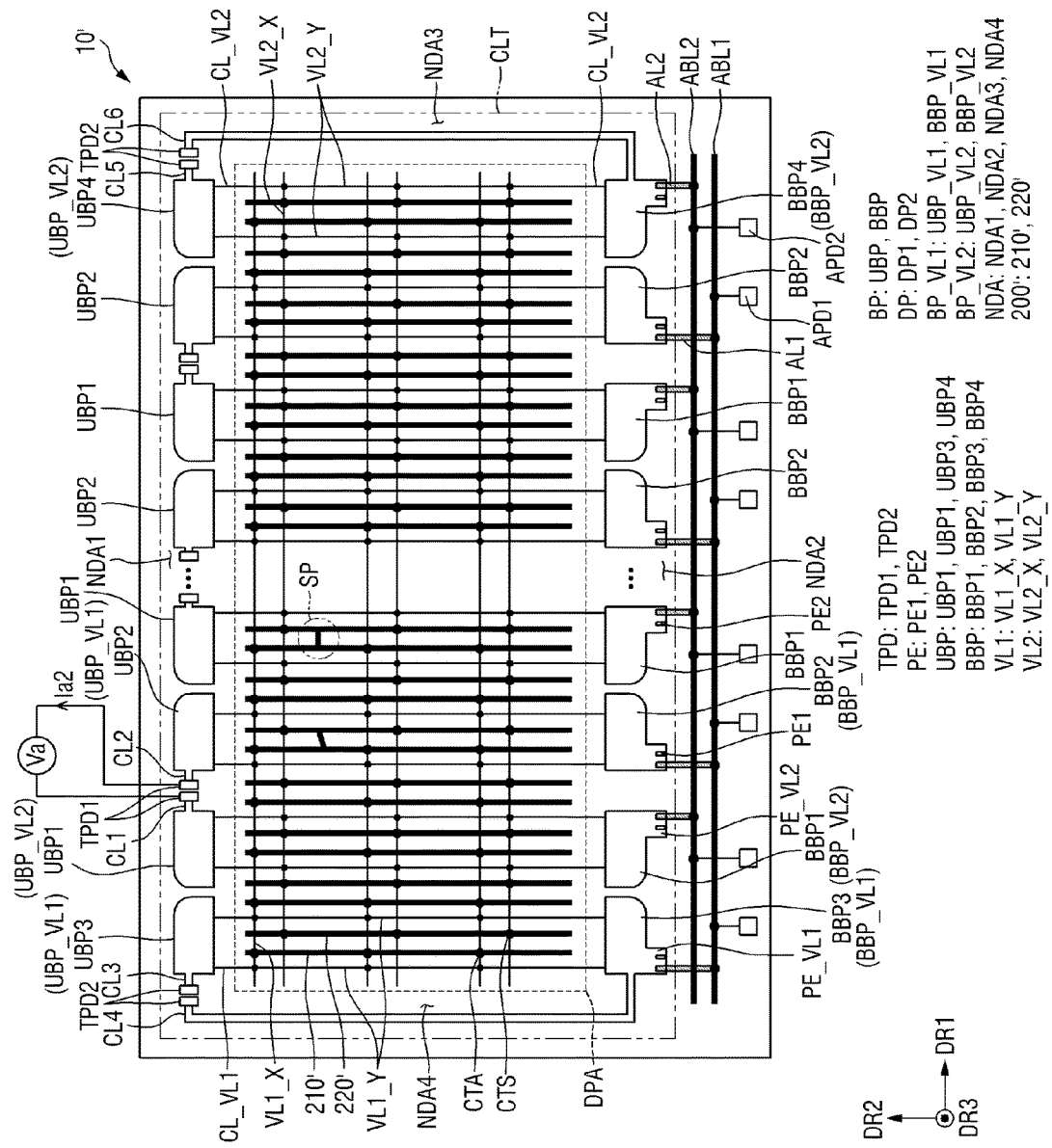

For example, referring to FIG. 14, in case that the first test voltage Va is applied using a first test pad TPD1, a first test current Ia2 may be measured. In case that a short SP occurs between first and second alignment lines 210' and 220' of the mother substrate 10' for the display device 10, resistance calculated using the first test voltage Va and the first test current Ia2 may be significantly smaller than the threshold resistance. In case that a reduction in the resistance calculated using the first test voltage Va and the first test current Ia2 is far greater than a reference value, it may be determined that a short has occurred between the first and second alignment lines 210' and 220'. For example, a short between the first and second alignment lines 210' and 220' may cause the first and second alignment lines 210' and 220' and the first and second voltage lines VL1 and VL2 to be connected to each other in the entire display area DPA. Accordingly, the area of the conductive layer may significantly increase, thereby reducing resistance.

Since the first test pads TPD1 are formed on a side facing another side of the mother substrate 10' on which the first and second alignment bus lines ABL1 and ABL2 and the first and second alignment connection lines AL1 and AL2 are formed, test reliability for determining whether a short has occurred between the first and second alignment lines 210' and 220' can be improved. For example, if the first test pads TPD1 are disposed adjacent to the first and second alignment bus lines ABL1 and ABL2 and the first and second alignment connection lines AL1 and AL2, in case that a short occurs between the first and second alignment bus lines ABL1 and ABL2 and the first and second alignment connection lines AL1 and AL2, a current may flow to the shorted area. Thus, it may be determined that a short has occurred in the display area DPA even though the short has not occurred. For this reason, in the mother substrate 10' for the display device 10 according to the embodiment, the first test pads TPD1 may be spaced apart from the first and second alignment bus lines ABL1 and ABL2 and the first and second alignment connection lines AL1 and AL2 with the display area DPA interposed between them. Accordingly, a current flowing according to a voltage applied through each first test pad TPD1 may flow from the first sub-test pads TPD1_1 to the second sub-test pads TPD1_2 via lines disposed in the display area DPA. Therefore, it is possible to distinguish whether a short has occurred in the display area DPA or in the cell peripheral area through a difference in the magnitude of calculated resistance.

Figure 15:
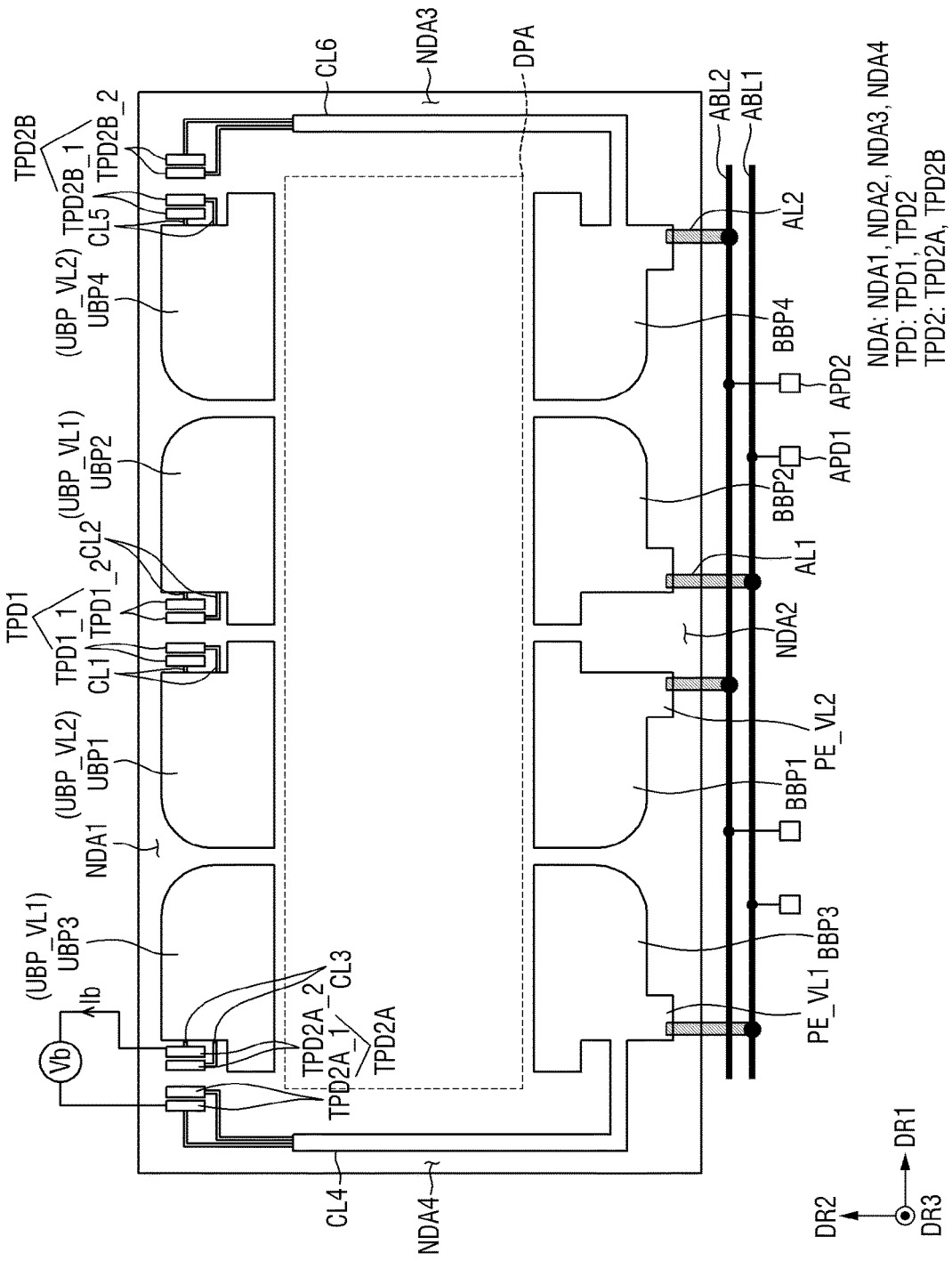

Referring to FIG. 15, it is tested whether the first alignment lines 210' or the second alignment lines 220' are open using the second test pads TPD2. A method of testing whether the first alignment lines 210' are open and a method of testing whether the second alignment lines 220' are open are substantially the same except for a pad that applies a voltage. Therefore, a process of testing whether the first alignment lines 210' are open will be described, and a redundant description of a process of testing whether the second alignment lines 220' are open will be omitted.

A second test current Ib is measured by applying a second test voltage Vb to ends of third sub-test pads TPD2A_1 and fourth sub-test pads TPD2A_2 of a first voltage open test pad TPD2A. Test resistance is calculated using the second test voltage Vb and the measured second test current Ib. It is determined whether the first alignment lines 210' are open using a difference between the calculated test resistance and threshold resistance.

Figure 16:
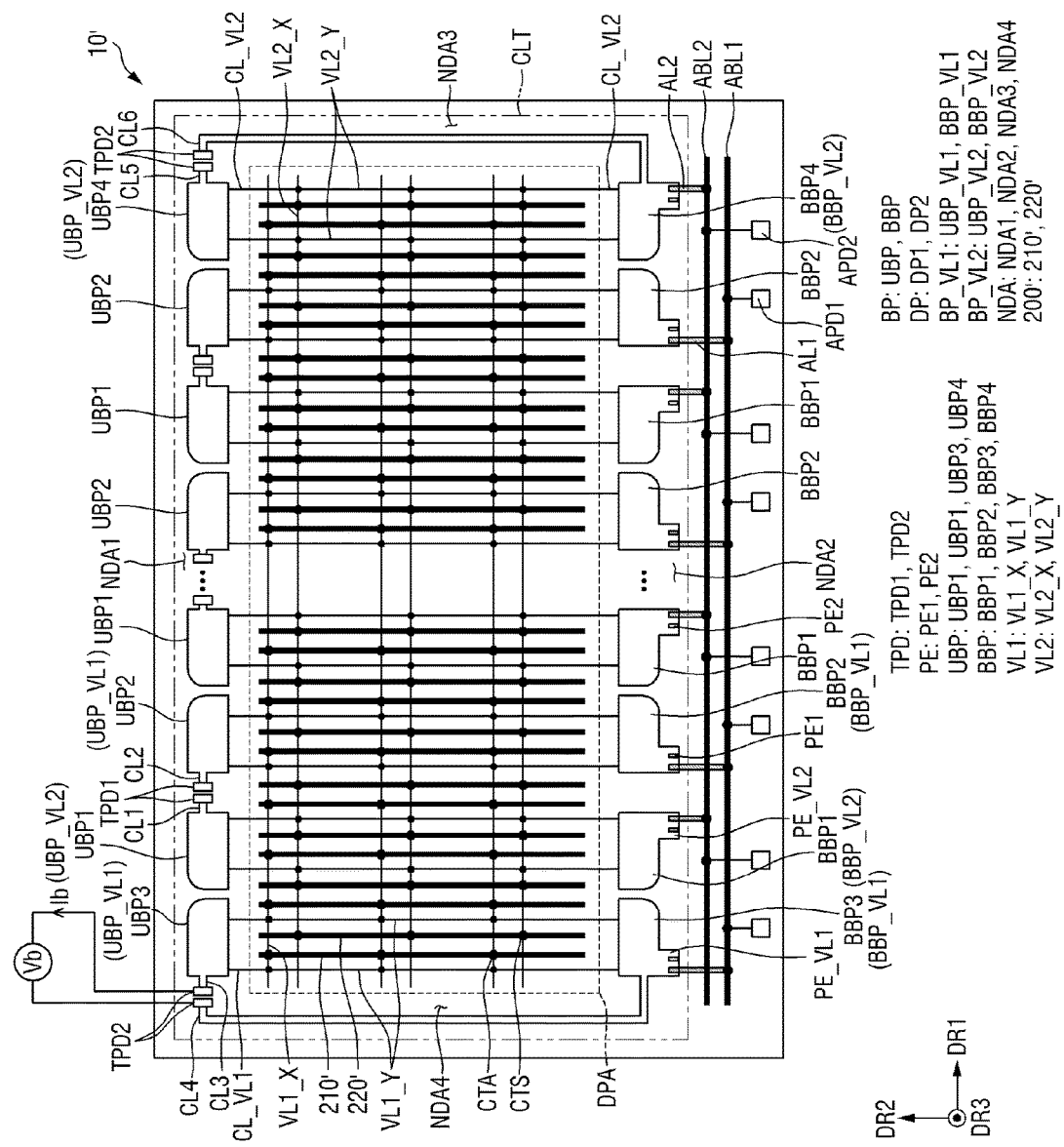

For example, referring to FIG. 16, in case that the second test voltage Vb is applied using a second test pad TPD2, the second test current Ib may be measured. If the first alignment lines 210' of the mother substrate 10' for the display device 10 are patterned normally, resistance calculated using the second test voltage Vb and the second test current Ib may have a value substantially equal to zero or equal to or less than the threshold resistance. It may be determined that the first alignment lines 210' are not open.

Figure 17:
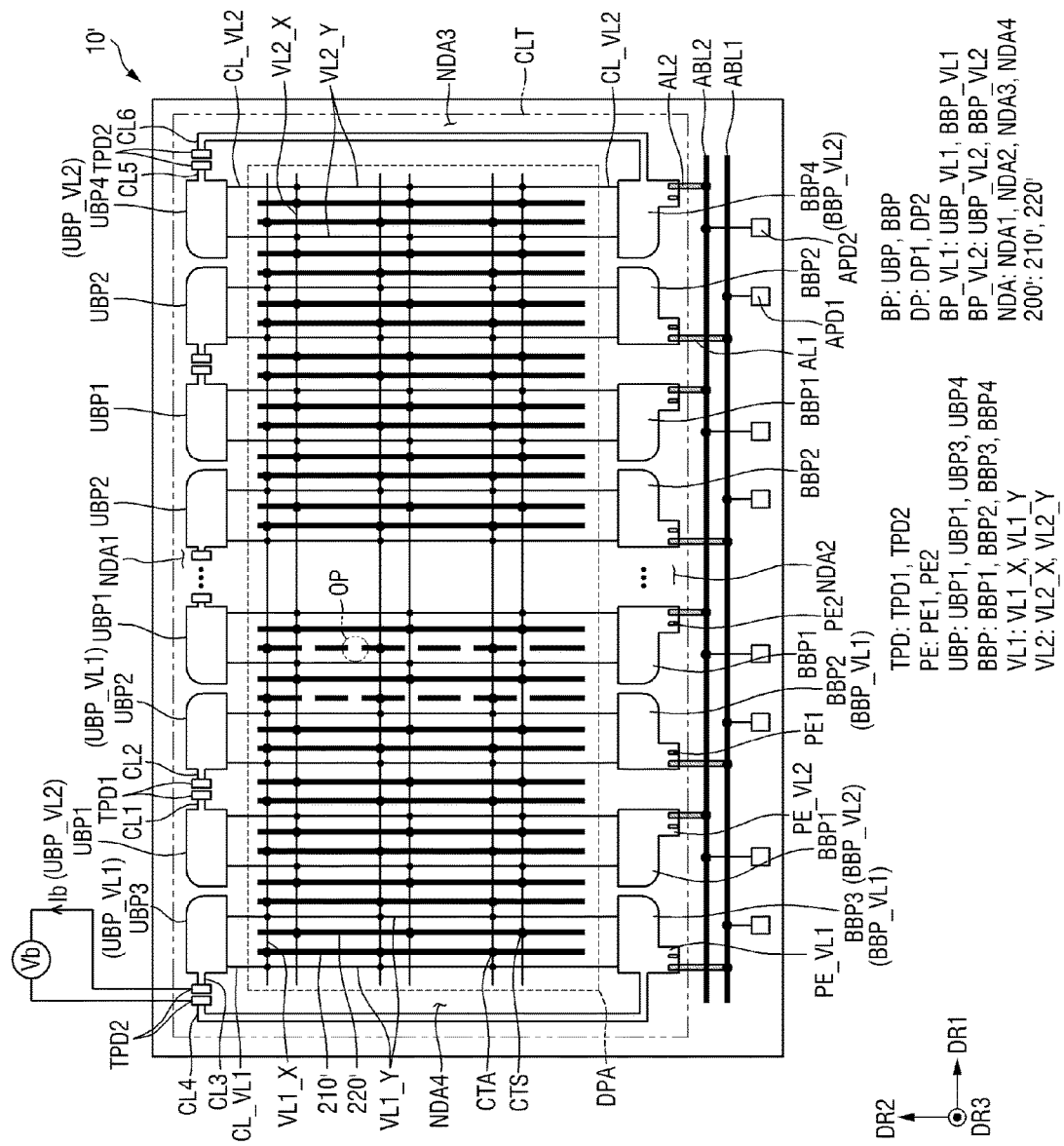

For example, referring to FIG. 17, in case that the second test voltage Vb is applied using a second test pad TPD2, the second test current Ib may be measured. In case that a defect occurs because some regions of the first alignment lines 210' of the mother substrate 10' for the display device 10 are open (OP), resistance calculated using the second test voltage Vb and the second test current Ib may be significantly greater than the threshold resistance. In case that an increase in the resistance calculated using the second test voltage Vb and the second test current Ib is far greater than a reference value, it may be determined that some regions of the first alignment lines 210' are open. For example, the open regions of the first alignment lines 210' may cause the area of a conductive layer, through which the second test current Ib flows, to decrease, thereby increasing resistance.

Figure 18:
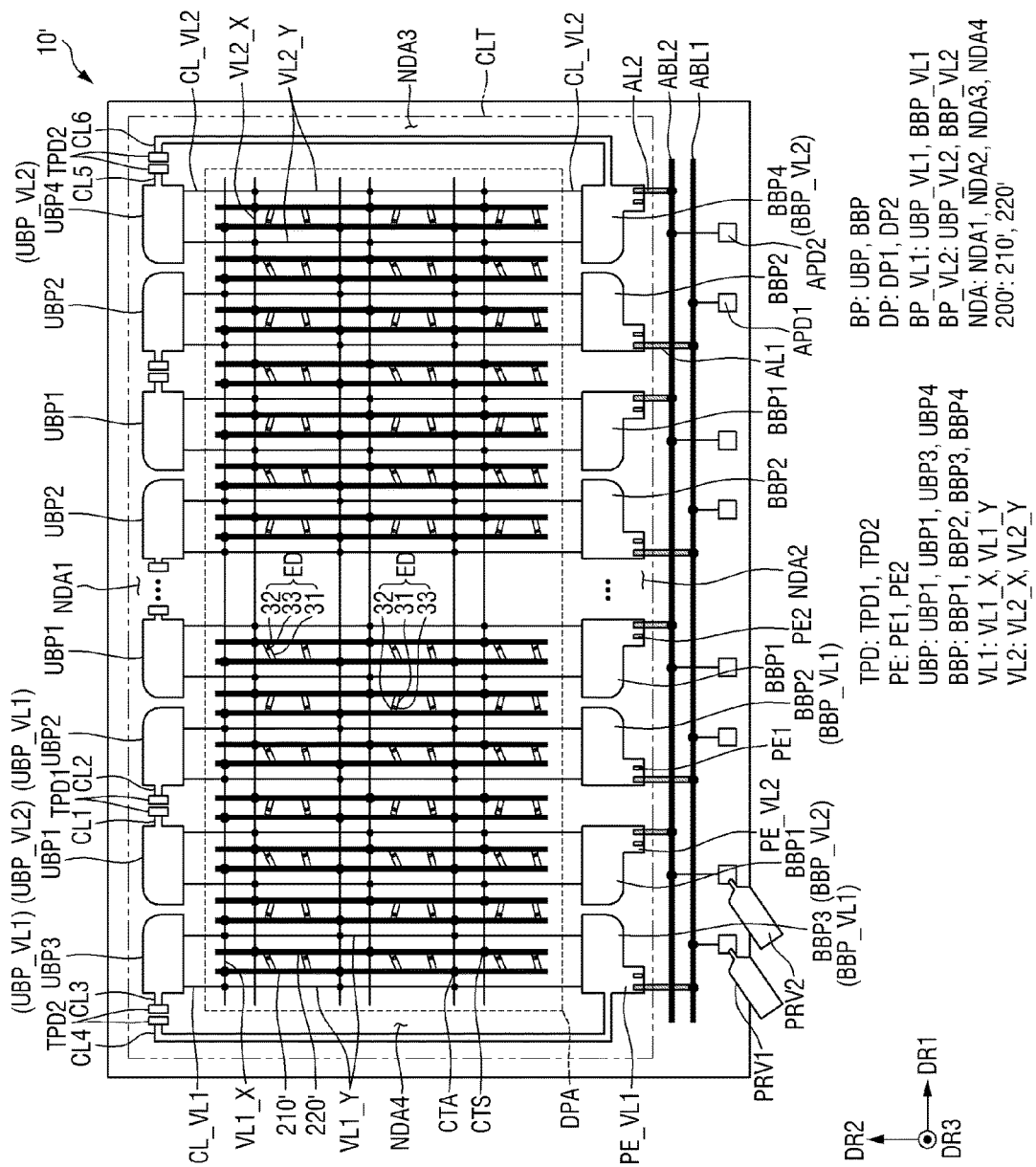

Referring to FIG. 18, ink in which light emitting elements ED are dispersed is sprayed onto the display area DPA, and a first alignment signal and a second alignment signal are respectively transmitted to the first alignment pads APD1 and the second alignment pads APD2 to align the light emitting elements ED.

A first probe PRV1 and a second probe PRV2 respectively contact the first alignment pads APD1 and the second alignment pads APD2 to transmit the first alignment signal to the first alignment pads APD1 and the second alignment signal to the second alignment pads APD2 through the first probe PRV1 and the second probe PRV2. Accordingly, the first alignment signal transmitted to the first alignment pads APD1 may be transferred to the first lower voltage bus patterns BBP_VL1 through the first alignment bus line ABL1 and the first alignment connection lines AL1 and may be transferred from the first lower voltage bus patterns BBP_VL1 to the first alignment lines 210' via the first voltage lines VL1 disposed in the display area DPA. The second alignment signal transmitted to the second alignment pads APD2 may be transferred to the second lower voltage bus patterns BBP_VL2 through the second alignment bus line ABL2 and the second alignment connection lines AL2 and may be transferred from the second lower voltage bus patterns BBP_VL2 to the second alignment lines 220' via the second voltage lines VL2 disposed in the display area DPA.

Figure 19:
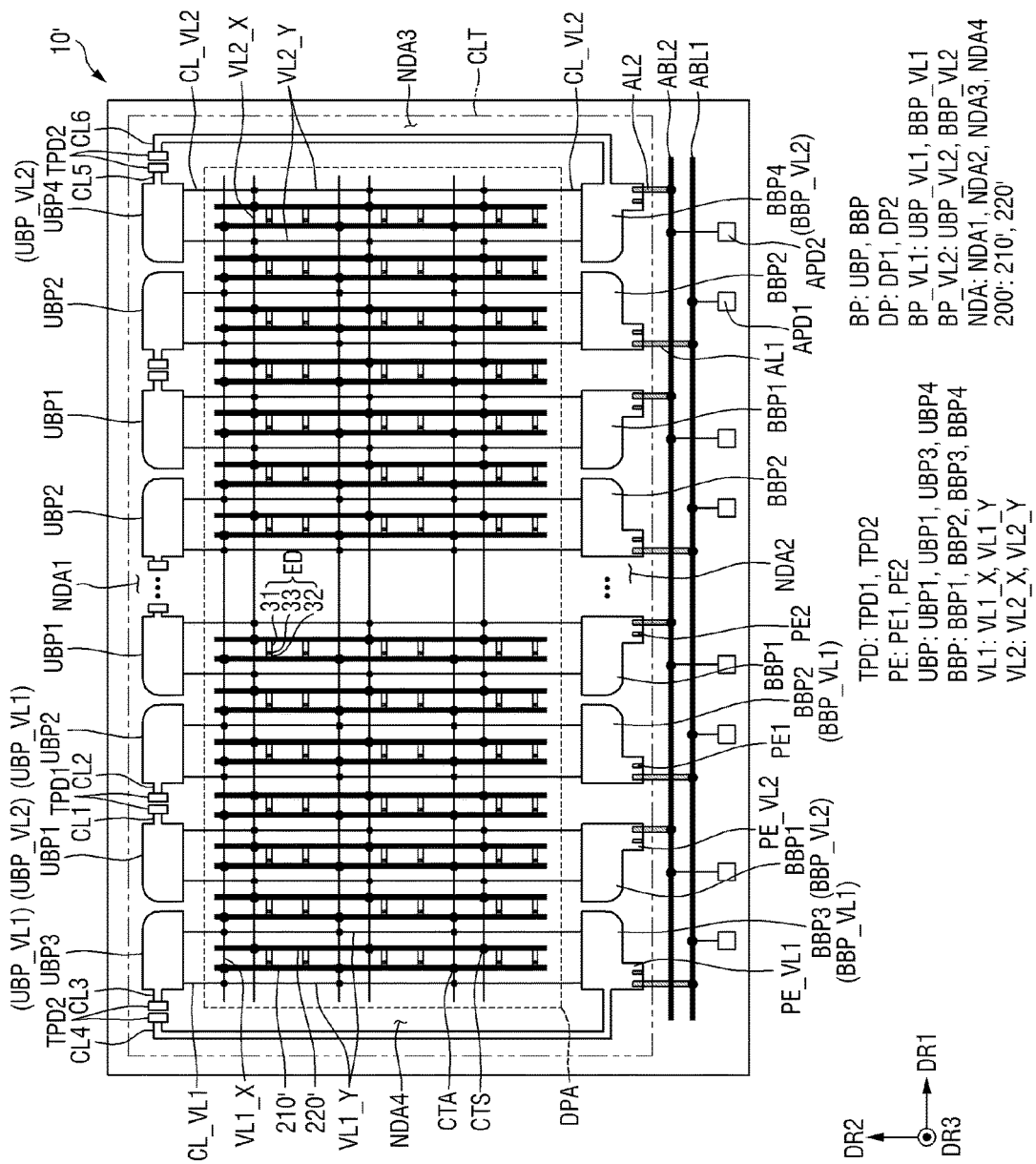

An electric field may be generated between the first alignment lines 210' to which the first alignment signal is transmitted and the second alignment lines 220' to which the second alignment signal is transmitted. The light emitting elements ED sprayed on the display area DPA of the mother substrate 10' may receive a dielectrophoretic force due to the electric field and thus may be aligned such that a specific end of each light emitting element ED faces a specific alignment line 210' or 220' as illustrated in FIG. 19.

Figure 20:
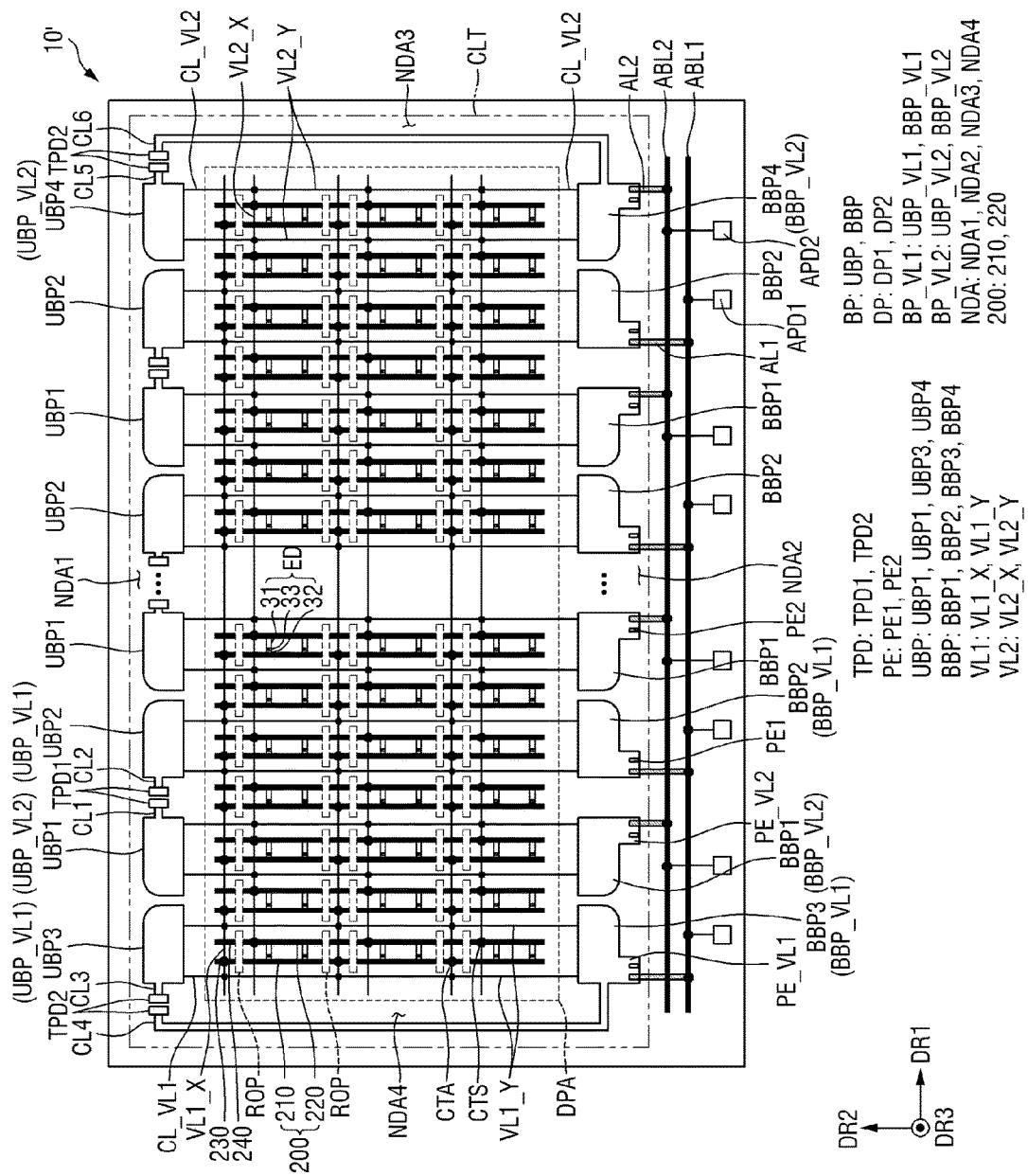

Referring to FIG. 20, portions of the first alignment lines 210' which overlap separation portions ROP and portions of the second alignment lines 220' which overlap the separation portions ROP are removed to form the first electrodes 210 and the second electrodes 220. Through this separation process, the portions of the first alignment lines 210' which overlap the separation portions ROP are removed to form the first electrodes 210 and the first dummy patterns 230 spaced apart from each other in the second direction DR2, and the portions of the second alignment lines 220' which overlap the separation portions ROP are removed to form the second electrodes 220 and the second dummy patterns 240 spaced apart from each other in the second direction DR2.

Through this separation process, the first dummy patterns 230 and the first electrodes 210 electrically connected to the first voltage lines VL1 through the alignment contact holes CTA may be electrically insulated. Accordingly, in each pixel PX, a first electrode 210 connecting an end of each light emitting element ED to a transistor of a circuit element layer may be electrically insulated from a first voltage line VL1.

Through this separation process, the second electrodes 220 electrically connected to the second voltage lines VL2 through the second electrode contact holes CTS may transmit a second power supply voltage to the pixels PX.

Figure 21:
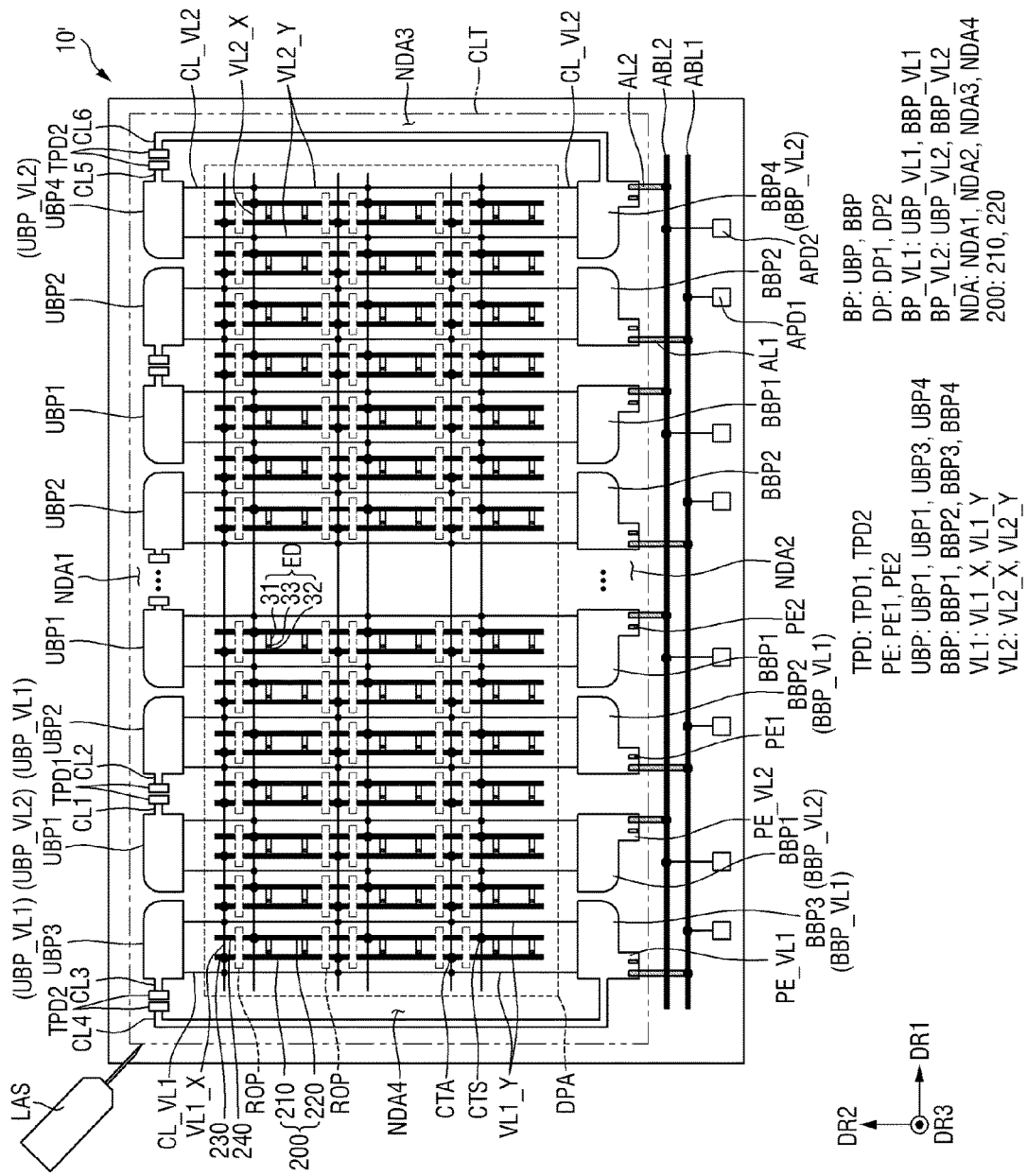

Referring to FIG. 21, the mother substrate 10' is cut along the cutting line CLT to produce the display device 10 as illustrated in FIG. 2. In this cutting process, the mother substrate 10' may be cut along the cutting line CLT using a laser LAS, but the disclosure is not limited thereto. Since each side of the display device 10 is cut along the cutting line CLT through this cutting process, portions of the first and second alignment connection lines AL1 and AL2 which overlap the cell area defined by the cutting line CLT may remain in the display device 10, and the other portions of the first and second alignment connection lines AL1 and AL2 which overlap the cell peripheral area may be removed. Accordingly, the first and second alignment connection lines AL1 and AL2 disposed in the cell peripheral area may be removed to form first and second alignment dummy patterns DP1 and DP2 aligned with a lower side of the display device 10 as illustrated in FIG. 2.

Hereinafter, other embodiments of the display device will be described.

Figure 22:
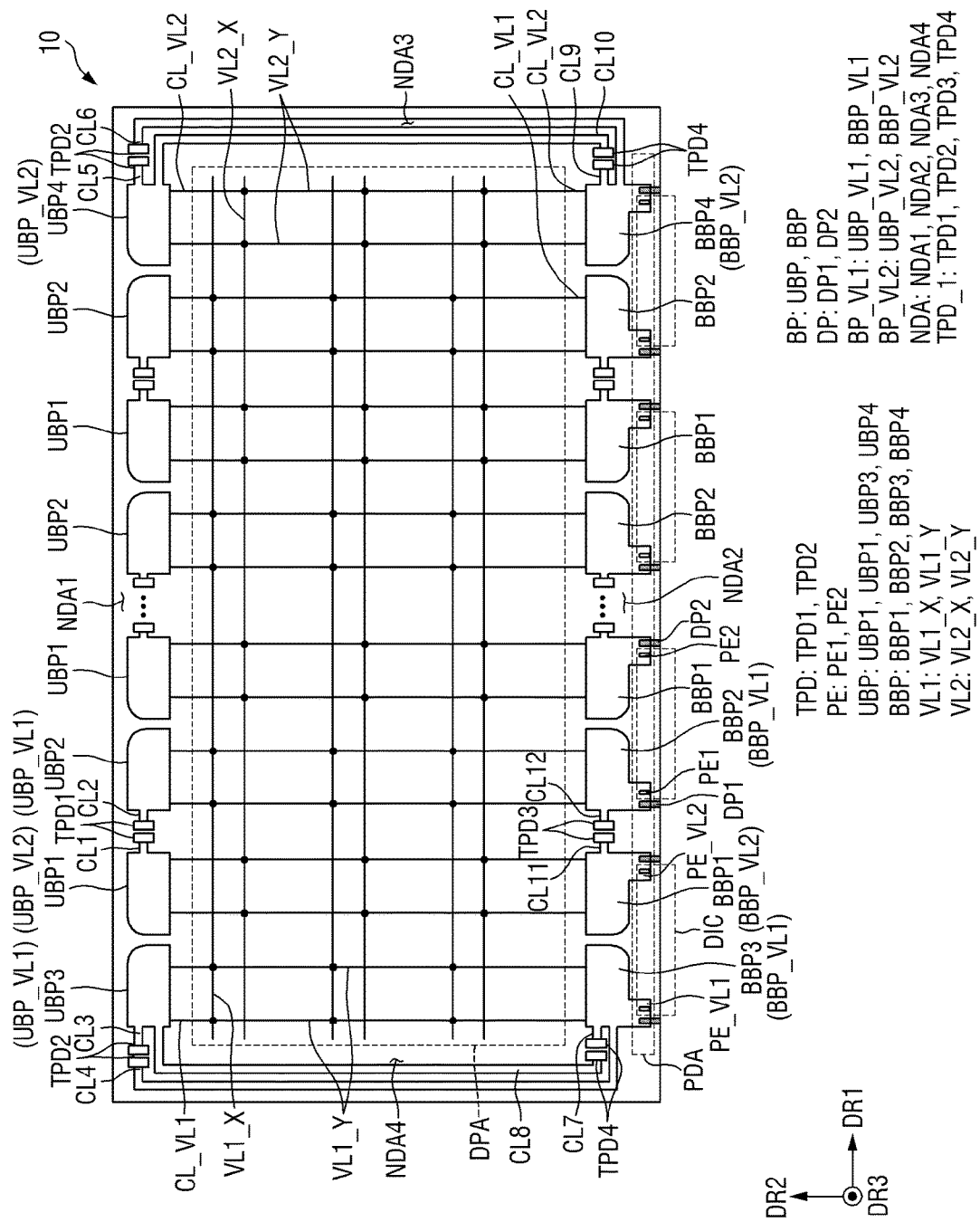
FIG. 22 is a schematic plan layout view of a display device according to an embodiment.

FIG. 22 is a schematic plan layout view of a display device 10 according to an embodiment.

Referring to FIG. 22, the display device 10 according to the embodiment is different from the display device 10 according to the embodiment of FIG. 2 at least in that test pads TPD_1 are also disposed in a second non-display area NDA2 in which first and second alignment dummy patterns DP1 and DP2 are formed.

The test pads TPD_1 may further include third test pads TPD3 and fourth test pads TPD4. The third test pads TPD3 and the fourth test pads TPD4 may be disposed between a display area DPA and a pad area PDA.

The third test pads TPD3 may be disposed between first lower bus patterns BBP1 and second lower bus patterns BBP2 among lower bus patterns BBP. Third test pads TPD3 may be provided, and one of the third test pads TPD3 in each pair may be connected to a first lower bus pattern BBP1 through an eleventh connection line CL11, and the other of the third test pads TPD3 in each pair may be connected to a second lower bus pattern BBP2 through a twelfth connection line CL12. The first lower bus patterns BBP1 may be second lower voltage bus patterns BBP_VL2, and the second lower bus patterns BBP2 may be first lower voltage bus patterns BBP_VL1. Accordingly, the third test pads TPD3 may be test pads used in a test process for testing whether a short has occurred between first and second alignment lines 210' and 220' before an inkjet printing process and an alignment process for aligning light emitting elements ED are performed during a manufacturing process of the display device 10.

The fourth test pads TPD4 may be disposed between a third lower bus pattern BBP3 and a third upper bus pattern UBP3 or between a fourth lower bus pattern BBP4 and a fourth upper bus pattern UBP4. The fourth test pads TPD4 may be disposed adjacent to the third lower bus pattern BBP3 and/or the fourth lower bus pattern BBP4 in the second non-display area NDA2.

One of the fourth test pads TPD4 may be connected to the third lower bus pattern BBP3 through a seventh connection line CL7, and the other of the fourth test pads TPD4 may be connected to the third upper bus pattern UBP3 through an eighth connection line CL8. The third lower bus pattern BBP3 may be a first lower voltage bus pattern BBP_VL1, and the third upper bus pattern UBP3 may be a first upper voltage bus pattern UBP_VL1. Accordingly, the fourth test pads TPD4 connected to the third lower bus pattern BBP3 and the third upper bus pattern UBP3 may be test pads used in a test process for testing whether the first alignment lines 210' are open before the inkjet printing process and the alignment process for aligning the light emitting elements ED are performed during the manufacturing process of the display device 10.

Another one of the fourth test pads TPD4 may be connected to the fourth lower bus pattern BBP4 through a ninth connection line CL9, and another one of the fourth test pads TPD4 may be connected to the fourth upper bus pattern UBP4 through a tenth connection line CL10. The fourth lower bus pattern BBP4 may be a second lower voltage bus pattern BBP_VL2, and the fourth upper bus pattern UBP4 may be a second upper voltage bus pattern UBP_VL2. Accordingly, the fourth test pads TPD4 connected to the fourth lower bus pattern BBP4 and the fourth upper bus pattern UBP4 may be test pads used in a test process for testing whether the second alignment lines 220' are open before the inkjet printing process and the alignment process for aligning the light emitting elements ED are performed during the manufacturing process of the display device 10.

In case that the test pads TPD_1 are formed in each of a first non-display area NDA1 and the second non-display area NDA2 of a mother substrate 10', the position of test pads used in a process of testing whether alignment lines are defective may vary according to the position where alignment bus lines and alignment connection lines used in an alignment process are formed. For example, in case that the alignment bus lines and the alignment connection lines used in the alignment process are formed in a cell peripheral area adjacent to the second non-display area NDA2, a process of testing alignment lines 200' may be performed using first and second test pads TPD1 and TPD2 formed in the first non-display area NDA1. In contrast, in case that the alignment bus lines and the alignment connection lines used in the alignment process are formed in the cell peripheral area adjacent to the first non-display area NDA1, the process of testing the alignment lines 200' may be performed using the third and fourth test pads TPD3 and TPD4 formed in the second non-display area NDA2.

In the display device 10 according to the embodiment, the test pads TPD_1 may be formed in each of the first and second non-display areas NDA1 and NDA2 so that they can be selectively used in a test process according to the position where alignment bus lines and alignment connection lines used in an alignment process are formed. Therefore, even in case that cell areas are included in a same mother substrate 10', there is no need to pattern each cell area differently. Thus, the display device 10 can be designed easily.

Figure 23:
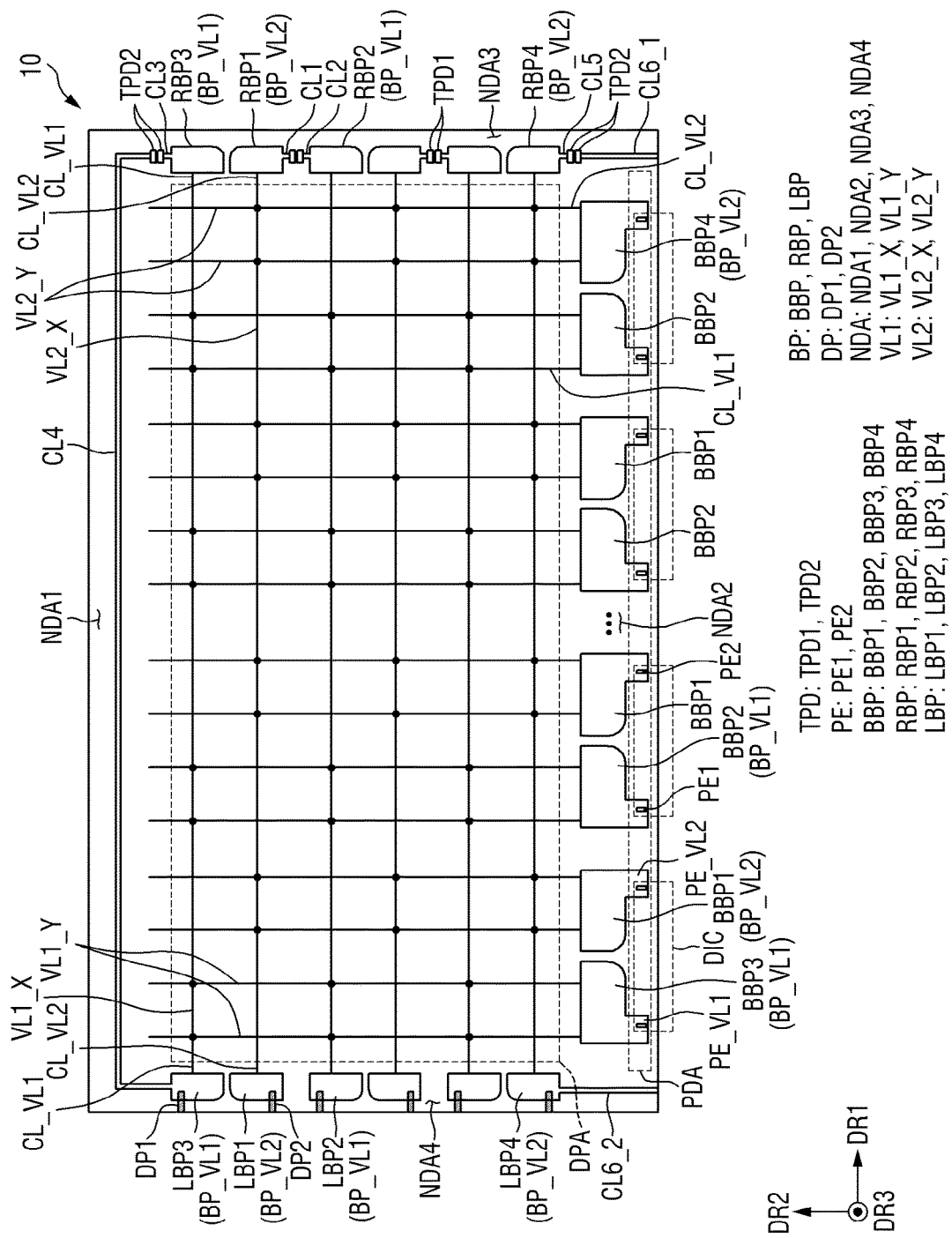
FIG. 23 is a schematic plan layout view of a display device according to an embodiment.
Figure 24:
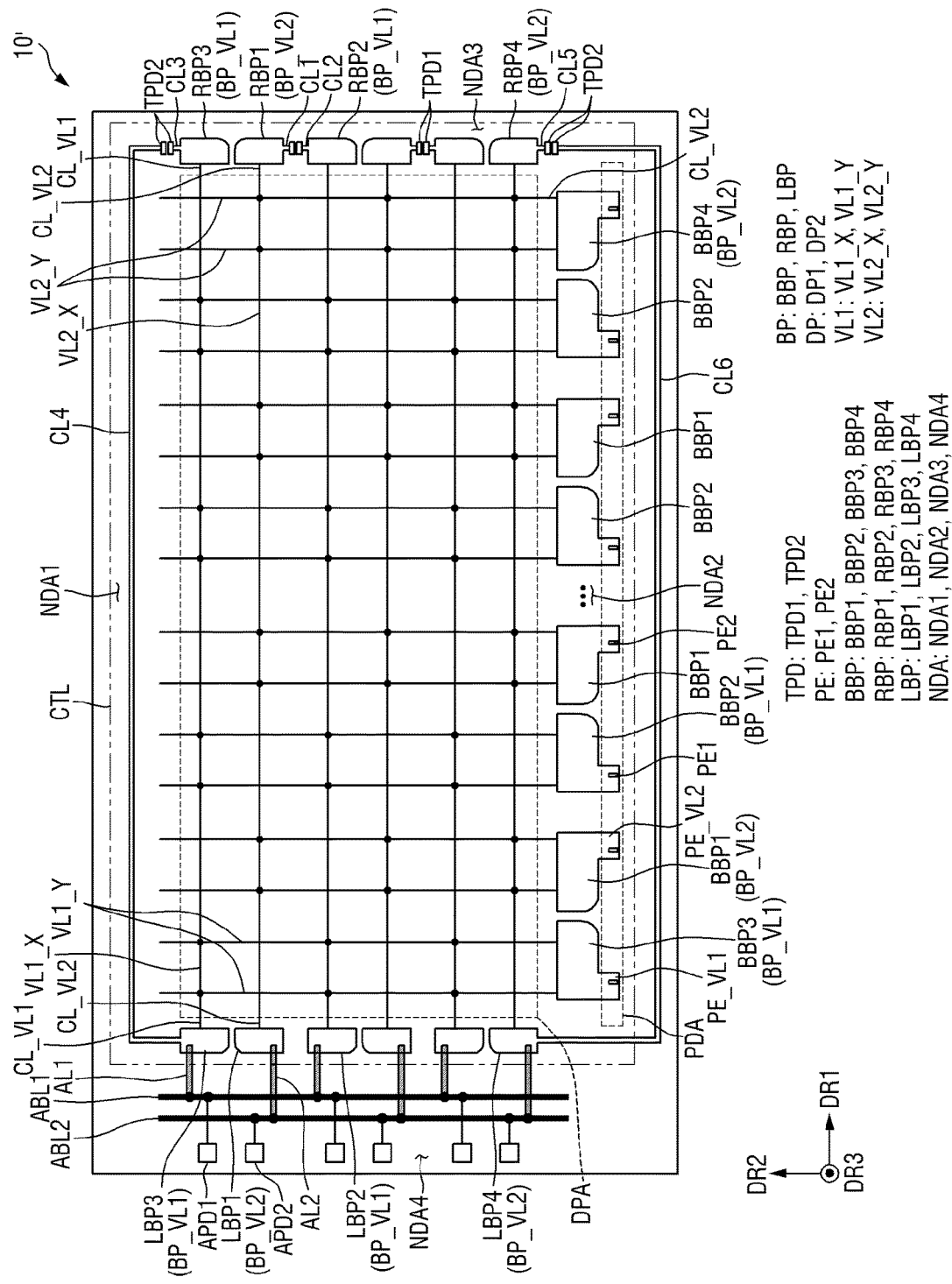
FIG. 24 is a schematic plan layout view of a mother substrate for the display device of FIG. 23.

FIG. 23 is a schematic plan layout view of a display device 10 according to an embodiment. FIG. 24 is a schematic plan layout view of a mother substrate 10' for the display device 10 of FIG. 23.

Referring to FIGS. 23 and 24, test pads TPD of the display device 10 according to the embodiment may be formed in each of a third non-display area NDA3 and a fourth non-display area NDA4 located on right and left sides of a display area DPA.

Bus patterns BP may include right bus patterns RBP disposed in the third non-display area NDA3 and left bus patterns LBP disposed in the fourth non-display area NDA4.

Right bus patterns RBP may be provided, and the right bus patterns RBP may be arranged side by side in the second direction DR2. The right bus patterns RBP may include first to fourth right bus patterns RBP1 to RBP4.

The first right bus patterns RBP1 may be electrically connected to second horizontal voltage lines VL2_X through second voltage connection lines CL_VL2. The second right bus patterns RBP2 may be electrically connected to first horizontal voltage lines VL1_X through first voltage connection lines CL_VL1. The first right bus patterns RBP1 and the second right bus patterns RBP2 may be disposed adjacent to each other in the second direction DR2, and first test pads TPD1 may be disposed between a first right bus pattern RBP1 and a second right bus pattern RBP2 in each pair. The first test pads TPD1 may be connected to the first right bus pattern RBP1 and the second right bus pattern RBP2 in each pair through a first connection line CL1 and a second connection line CL2, respectively.

The third right bus pattern RBP3 may be an uppermost right bus pattern RBP among the right bus patterns RBP. The third right bus pattern RBP3 may be electrically connected to a first horizontal voltage line VL1_X through a first voltage connection line CL_VL1. The fourth right bus pattern RBP4 may be a lowermost right bus pattern RBP among the right bus patterns RBP. The fourth right bus pattern RBP4 may be electrically connected to a second horizontal voltage line VL2_X through a second voltage connection line CL_VL2.

Second test pads TPD2 may be disposed adjacent to each of the third right bus pattern RBP3 and the fourth right bus pattern RBP4. The second test pads TPD2 disposed adjacent to the third right bus pattern RBP3 may be connected to the third right bus pattern RBP3 through a third connection line CL3 and may be connected to a third left bus pattern LBP3 to be described below through a fourth connection line CL4. One of the second test pads TPD2 disposed adjacent to the fourth right bus pattern RBP4 may be connected to the fourth right bus pattern RBP4 through a fifth connection line CL5. The other of the second test pads TPD2 disposed adjacent to the fourth right bus pattern RBP4 may be connected to a first dummy line CL6_1. A fourth left bus pattern LBP4 may be connected to a second dummy line CL6_2. The first dummy line CL6_1 and the second dummy line CL6_2 may be dummy lines remaining after a portion of a sixth connection line CL6 connecting the second test pads TDP2 disposed adjacent to the fourth right bus pattern RBP4 and the fourth left bus pattern LBP4 in the mother substrate 10' for the display device 10 of FIG. 24 is cut in a cutting process. Since the sixth connection line CL6 is formed to bypass a pad area PDA disposed on a lower side of the display device 10, it may be cut in a cutting process during a manufacturing process of the display device 10.

Left bus patterns LBP may be provided, and the left bus patterns LBP may be arranged side by side in the second direction DR2. The left bus patterns LBP may include first to fourth left bus patterns LBP1 to LBP4. The first to fourth left bus patterns LBP1 to LBP4 may be disposed to correspond to the first to fourth right bus patterns RBP1 to RBP4.

The first left bus patterns LBP1 may be electrically connected to the second horizontal voltage lines VL2_X through second voltage connection lines CL_VL2. The second left bus patterns LBP2 may be electrically connected to the first horizontal voltage lines VL1_X through first voltage connection lines CL_VL1. The first left bus patterns LBP1 and the second left bus patterns LBP2 may be disposed adjacent to each other in the second direction DR2. The first and second left bus patterns LBP1 and LBP2 may not be disposed adjacent to test pads.

The third left bus pattern LBP3 may be an uppermost left bus pattern LBP among the left bus patterns LBP. The third left bus pattern LBP3 may be electrically connected to a first horizontal voltage line VL1_X through a first voltage connection line CL_VL1. The fourth left bus pattern LBP4 may be a lowermost left bus pattern LBP among the left bus patterns LBP. The fourth left bus pattern LBP4 may be electrically connected to a second horizontal voltage line VL2_X through a second voltage connection line CL_VL2.

The third left bus pattern LBP3 may be connected to the second test pads TPD2 disposed adjacent to the third right bus pattern RBP3 through the fourth connection line CL4. The fourth left bus pattern LBP4 may be connected to the second dummy line CL6_2. An end of each of the first and second dummy lines CL6_1 and CL6_2 may be aligned with the lower side of the display device 10.

The second right bus patterns RBP2, the third right bus pattern RBP3, the second left bus patterns LBP2, and the third left bus pattern LBP3 may be first voltage bus patterns BP_VL1 connected to first voltage lines VL1. The first right bus patterns RBP1, the fourth right bus pattern RBP4, the first left bus patterns LBP1, and the fourth left bus pattern LBP4 may be second voltage bus patterns BP_VL2 connected to second voltage lines VL2.

First alignment dummy patterns DP1 and second alignment dummy patterns DP2 may be respectively connected to the first voltage bus patterns BP_VL1 and the second voltage bus patterns BP_VL2 disposed in the fourth non-display area NDA4. The first alignment dummy patterns DP1 may be connected to the third and second left bus patterns LBP3 and LBP2, and the second alignment dummy patterns DP2 may be connected to the first and fourth left bus patterns LBP1 and LBP4.

The first alignment dummy patterns DP1 may be dummy patterns remaining after first alignment connection lines AL1 transferring a first alignment signal transmitted to first alignment pads APD1 of FIG. 24 to the first voltage bus patterns BP_VL1 disposed in the fourth non-display area NDA4 through a first alignment bus line ABL1 are cut. Similarly, the second alignment dummy patterns DP2 may be dummy patterns remaining after second alignment connection lines AL2 transferring a second alignment signal transmitted to second alignment pads APD2 of FIG. 24 to the second voltage bus patterns BP_VL2 disposed in the fourth non-display area NDA4 through a second alignment bus line ABL2 are cut.

In the display device 10 and the mother substrate 10' for the display device 10 according to the embodiment, the alignment bus lines ABL1 and ABL2 and the alignment pads APD1 and APD2 used in an alignment process for aligning light emitting elements ED during the manufacturing process of the display device 10 may be formed adjacent to a left side of the mother substrate 10', and the test pads TPD may be formed adjacent to a right side of the mother substrate 10'. Accordingly, the display area DPA may be located between the alignment bus lines ABL1 and ABL2, the alignment connection lines AL1 and AL2, the alignment pads APD1 and APD2 and the test pads TPD. Therefore, in case that a test voltage is applied to the test pads TPD, a test current may essentially flow through lines disposed in the display area DPA. Accordingly, even in case that a defect occurs in the alignment bus lines ABL1 and ABL2 or the alignment connection lines AL1 and AL2, since the test current flows through the display area DPA, the reliability of a test process for testing whether alignment lines 200' are defective using the test pads TPD can be improved.

Figure 25:
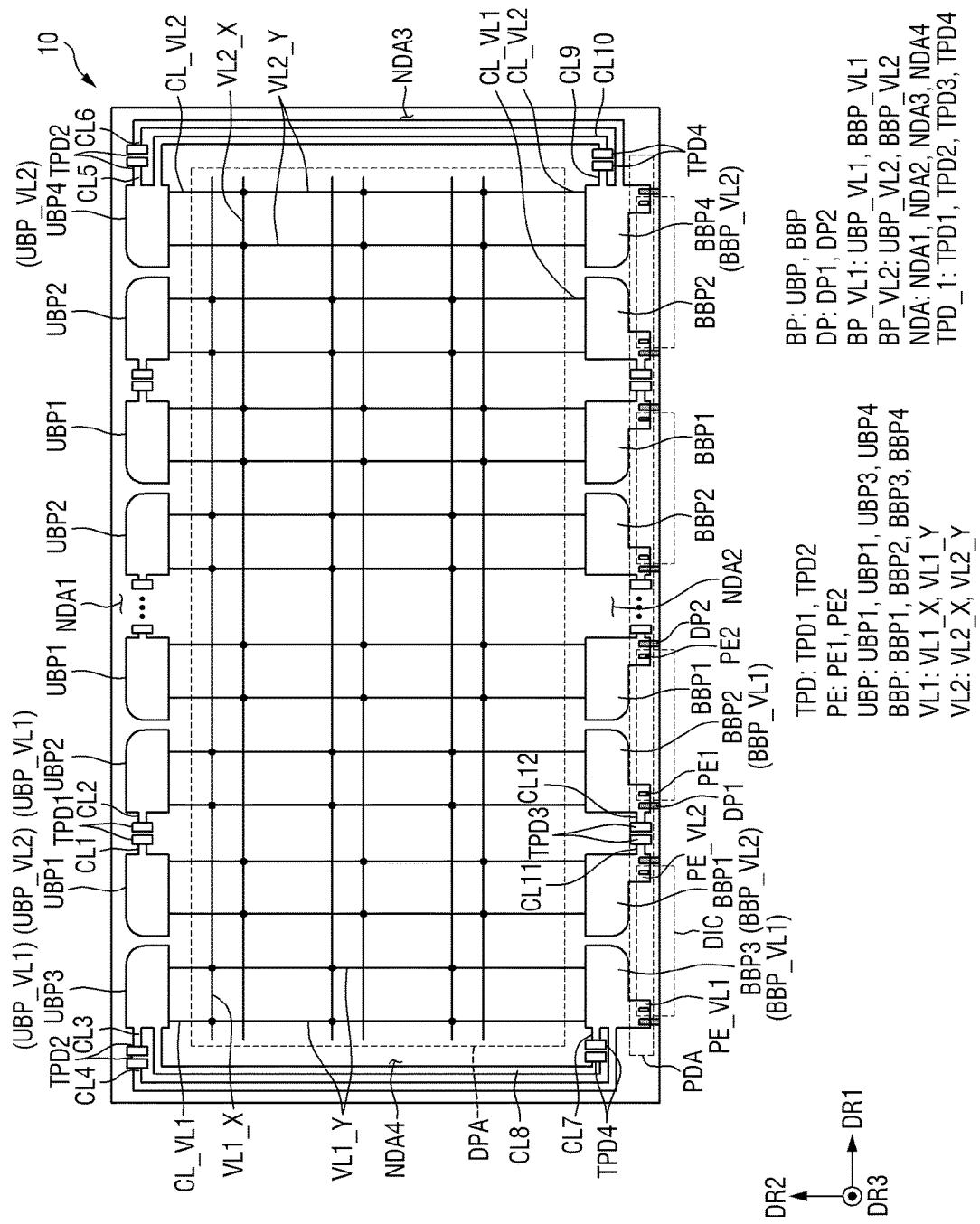
FIG. 25 is a schematic plan layout view of a display device according to an embodiment.

FIG. 25 is a schematic plan layout view of a display device 10 according to an embodiment.

Referring to FIG. 25, the display device 10 according to the embodiment is different from the display device 10 according to the embodiment of FIG. 22 at least in that third and fourth test pads TPD3 and TPD4 disposed in a second non-display area NDA2 overlap driving circuits DIC in the first direction DR1.

The third and fourth test pads TPD3 and TPD4 may be disposed in a pad area PDA. Accordingly, in case that a light blocking member is formed to expose the pad area PDA, the third and fourth test pads TPD3 and TPD4 may also be exposed by the light blocking member. Therefore, after the display device 10 is manufactured, it is possible to finally test whether first voltage lines VL1, second voltage lines VL2, and second electrodes 220 included in the display device 10 are defective.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display area and a first non-display area located on a side of the display area in a first direction;
a first bus pattern disposed in the first non-display area;
a second bus pattern disposed in the first non-display area and spaced apart from the first bus pattern in a second direction intersecting the first direction;
first voltage lines disposed in the display area, extending in the first direction, and electrically connected to the first bus pattern;
second voltage lines disposed in the display area, extending in the first direction, and electrically connected to the second bus pattern; and
a first test pad disposed in the first non-display area and disposed between the first bus pattern and the second bus pattern.

2. The display device of claim 1, wherein
the second bus pattern does not overlap the first voltage lines in the first direction, and
the first bus pattern does not overlap the second voltage lines in the first direction.

3. The display device of claim 1, wherein
the first test pad comprises:
a first sub-test pad electrically connected to the first bus pattern; and a second sub-test pad electrically connected to the second bus pattern, and
the first sub-test pad and the second sub-test pad are spaced apart from each other.

4. The display device of claim 3, further comprising:
a third bus pattern disposed in the first non-display area and spaced apart from the first bus pattern and the second bus pattern;
a fourth bus pattern disposed in a second non-display area spaced apart from the first non-display area in the first direction with the display area disposed between the fourth bus pattern and the first non-display area; and
a second test pad disposed adjacent to the third bus pattern in the first non-display area,
wherein the third bus pattern and the fourth bus pattern are electrically connected to the first voltage lines.

5. The display device of claim 4, wherein
the second test pad comprises:
a third sub-test pad electrically connected to the third bus pattern; and
a fourth sub-test pad electrically connected to the fourth bus pattern, and the third sub-test pad and the fourth sub-test pad are spaced apart from each other.

6. The display device of claim 4, further comprising:
an alignment dummy pattern disposed in the second non-display area and electrically connected to the fourth bus pattern.

7. The display device of claim 4, wherein the third bus pattern and the fourth bus pattern overlap each other in the first direction.

8. The display device of claim 1, further comprising:
a first electrode and a second electrode disposed in the display area, extending in the first direction, and spaced apart from each other in the second direction, wherein the second electrode is electrically connected to one of the second voltage lines through an electrode contact hole.

9. The display device of claim 8, further comprising:
a first dummy pattern spaced apart from the first electrode in the first direction,
wherein the first dummy pattern is electrically connected to one of the first voltage lines through an alignment contact hole.

10. The display device of claim 8, further comprising:
a light emitting element disposed between the first electrode and the second electrode.

11. A display device comprising:
a display area, a first non-display area located on a side of the display area in a first direction, and a second non-display area located on another side of the display area in the first direction;
a first bus pattern and a second bus pattern disposed in the first non-display area and spaced apart from each other;
a third bus pattern and a fourth bus pattern disposed in the second non-display area and spaced apart from each other;
a first voltage line disposed in the display area and electrically connected to the first bus pattern and the third bus pattern;
a second voltage line disposed in the display area and electrically connected to the second bus pattern and the fourth bus pattern;
a first test pad disposed between the first bus pattern and the second bus pattern in the first non-display area; and
a first alignment dummy pattern electrically connected to the third bus pattern and a second alignment dummy pattern electrically connected to the fourth bus pattern in the second non-display area.

12. The display device of claim 11, wherein
the first bus pattern and the third bus pattern overlap each other in the first direction, and
the second bus pattern and the fourth bus pattern overlap each other in the first direction.

13. The display device of claim 11, further comprising:
a first electrode and a second electrode spaced apart from each other on the first voltage line and the second voltage line in the display area; and
a light emitting element disposed between the first electrode and the second electrode,
wherein the second electrode is electrically connected to the second voltage line through an electrode contact hole.

14. The display device of claim 11, wherein the first alignment dummy pattern and the second alignment dummy pattern are aligned with a side of the display device adjacent to the second non-display area.

15. The display device of claim 11, further comprising:
a second test pad disposed between the third bus pattern and the fourth bus pattern in the second non-display area.

16. The display device of claim 11, further comprising:
a fifth bus pattern disposed in the first non-display area, spaced apart from the first bus pattern and the second bus pattern, and electrically connected to the first voltage line; and
a second test pad disposed adjacent to the fifth bus pattern in the first non-display area.

17. The display device of claim 16, further comprising:
a sixth bus pattern disposed in the second non-display area, spaced apart from the third bus pattern and the fourth bus pattern, and electrically connected to the first voltage line, wherein
the second test pad comprises:
a first sub-test pad electrically connected to the fifth bus pattern; and
a second sub-test pad electrically connected to the sixth bus pattern, and
the first sub-test pad and the second sub-test pad are spaced apart from each other.

18. The display device of claim 11, wherein
the first test pad comprises:
a first sub-test pad electrically connected to the first bus pattern; and
a second sub-test pad electrically connected to the second bus pattern, and
the first sub-test pad and the second sub-test pad are spaced apart from each other.

19. A mother substrate for a display device, the mother substrate comprising:
a cell area that is defined by a cutting line and comprises a display area, a first non-display area located on a side of the display area in a first direction and a second non-display area located on another side of the display area in the first direction, and a cell peripheral area;
a first bus pattern and a second bus pattern disposed in the first non-display area and spaced apart from each other;
a third bus pattern and a fourth bus pattern disposed in the second non-display area and spaced apart from each other;
a first voltage line disposed in the display area and electrically connected to the first bus pattern and the third bus pattern;
a second voltage line disposed in the display area and electrically connected to the second bus pattern and the fourth bus pattern;
a first test pad disposed between the first bus pattern and the second bus pattern in the first non-display area; and
a first alignment pad and a second alignment pad disposed in the cell peripheral area adjacent to the second non-display area.

20. The mother substrate of claim 19, further comprising:
a first alignment line electrically connected to the first voltage line; and
a second alignment line electrically connected to the second voltage line.

* * * * *